(12) United States Patent
Tahara et al.

(10) Patent No.: US 6,847,066 B2
(45) Date of Patent: Jan. 25, 2005

(54) SEMICONDUCTOR DEVICE

(75) Inventors: Iwao Tahara, Higashiyamato (JP); Ichiro Mihara, Tachikawa (JP); Yutaka Aoki, Ome (JP)

(73) Assignees: Oki Electric Industry Co., Ltd., Tokyo (JP); Casio Computer Co., Ltd., Tokyo (JP)

( * ) Notice: Subject to any disclaimer, the term of this patent is extended or adjusted under 35 U.S.C. 154(b) by 0 days.

(21) Appl. No.: 09/924,293

(22) Filed: Aug. 8, 2001

(65) Prior Publication Data
US 2002/0017730 A1 Feb. 14, 2002

(30) Foreign Application Priority Data

Aug. 11, 2000 (JP) ........................................ 2000-243765
Aug. 11, 2000 (JP) ........................................ 2000-243783

(51) Int. Cl.[7] ...................... H01L 27/148; H01L 29/168
(52) U.S. Cl. ........................ 257/243; 257/306; 438/149; 438/256
(58) Field of Search ................................ 257/306, 243, 257/308; 438/30, 149, 256, 384, 386

(56) References Cited

U.S. PATENT DOCUMENTS

| | | | | |
|---|---|---|---|---|
| 4,322,778 A | * | 3/1982 | Barbour et al. | 361/794 |
| 4,617,193 A | | 10/1986 | Wu | |
| 4,811,082 A | * | 3/1989 | Jacobs et al. | 257/700 |
| 4,903,116 A | | 2/1990 | Kohsiek | |
| 5,317,433 A | * | 5/1994 | Miyawaki et al. | 349/45 |
| 5,510,758 A | | 4/1996 | Fujita et al. | |
| 5,530,288 A | * | 6/1996 | Stone | 257/700 |
| 5,539,241 A | * | 7/1996 | Abidi et al. | 257/531 |
| 5,770,476 A | * | 6/1998 | Stone | 438/106 |
| 5,818,079 A | | 10/1998 | Noma et al. | |
| 5,928,968 A | | 7/1999 | Bothra et al. | |
| 5,982,018 A | * | 11/1999 | Wark et al. | 257/532 |
| 5,990,507 A | | 11/1999 | Mochizuki et al. | |
| 6,002,161 A | * | 12/1999 | Yamazaki | 257/531 |
| 6,025,218 A | | 2/2000 | Brotherton | |
| 6,031,293 A | | 2/2000 | Hsuan et al. | |
| 6,108,212 A | * | 8/2000 | Lach et al. | 361/768 |
| 6,124,606 A | * | 9/2000 | den Boer et al. | 257/291 |
| 6,140,155 A | | 10/2000 | Mihara et al. | |
| 6,163,456 A | | 12/2000 | Suzuki et al. | |
| 6,180,976 B1 | * | 1/2001 | Roy | 257/306 |
| 6,274,937 B1 | * | 8/2001 | Ahn et al. | 257/777 |
| 6,331,722 B1 | * | 12/2001 | Yamazaki et al. | 257/347 |
| 6,337,517 B1 | | 1/2002 | Ohta et al. | |
| 6,362,523 B1 | * | 3/2002 | Fukuda | 257/723 |
| 6,545,354 B1 | * | 4/2003 | Aoki et al. | 257/734 |
| 2003/0038331 A1 | | 2/2003 | Aoki et al. | |

FOREIGN PATENT DOCUMENTS

JP    5-218042 A    8/1993

OTHER PUBLICATIONS

Related to USSN 09/499,599 filed Feb. 7, 2000; Y. Aoki et al; Semiconductor Device.

(List continued on next page.)

Primary Examiner—George Fourson
Assistant Examiner—Fernando L. Toledo
(74) Attorney, Agent, or Firm—Frishauf, Holtz, Goodman & Chick, P.C.

(57) ABSTRACT

A thin film passive element includes at least one of a capacitance element having a plurality of conductive layers and a dielectric material layer and an inductance element formed of a patterned conductive layer is stacked on a circuit element-forming region of a semiconductor substrate provided with a plurality of connection pads and is connected to the circuit element of the circuit element-forming region.

23 Claims, 34 Drawing Sheets

OTHER PUBLICATIONS

Copy of Office Action dated Nov. 7, 2001 issued in co–pending U.S. Appl. No. 09/499,599, filed Feb. 7, 2000; Applicants: Yutaka Aoki et al.

Copy of Office Action dated May 2, 2002 issued in co–pending U.S. Appl. No. 09/499,599, filed Feb. 7, 2000; Applicants: Yutaki Aoki et al.

Copy of Office Action dated Jun. 25, 2004 issued in co–pending U.S. Appl. No. 10/254,222, filed Sep. 25, 2002; Applicants: Yutaka Aoki et al.

van Zant, Peter, Microchip Fabrication: A practical Guide to Semiconductor Processing, $4^{th}$ ed., 2000, McGrawhill, New York, pp. 3.

* cited by examiner

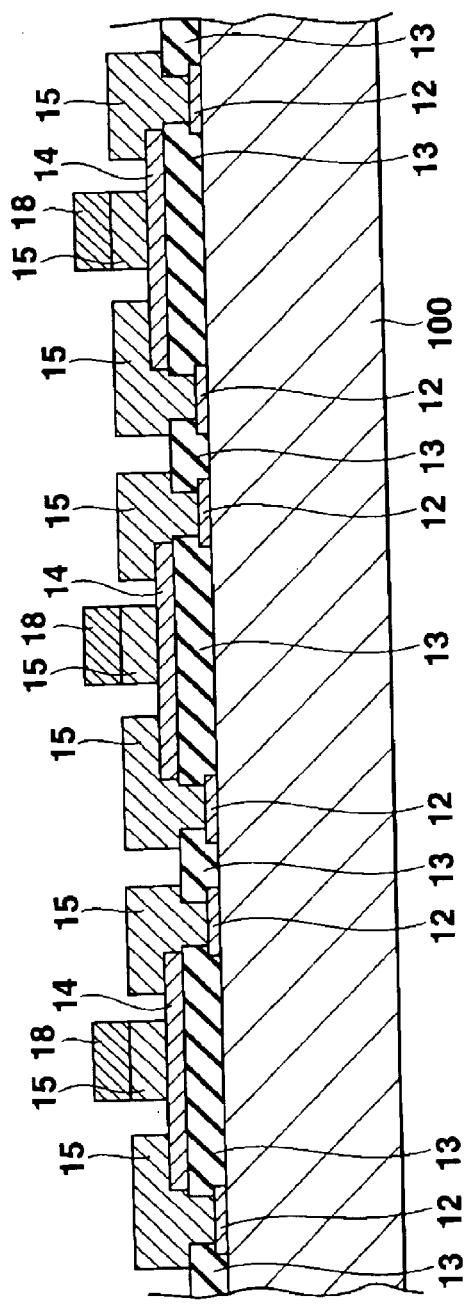
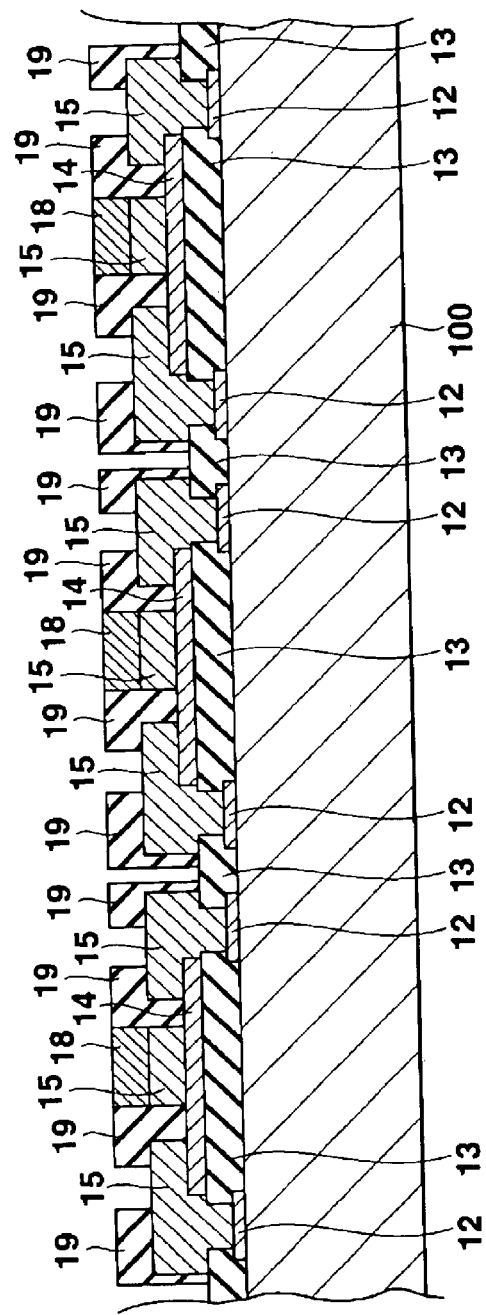
FIG.5
FIG.6

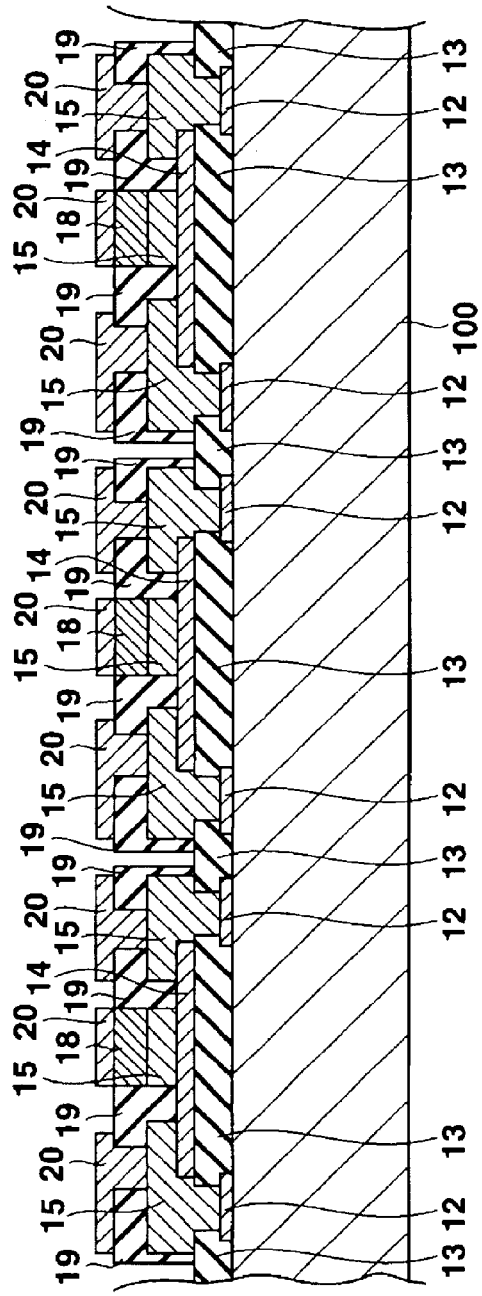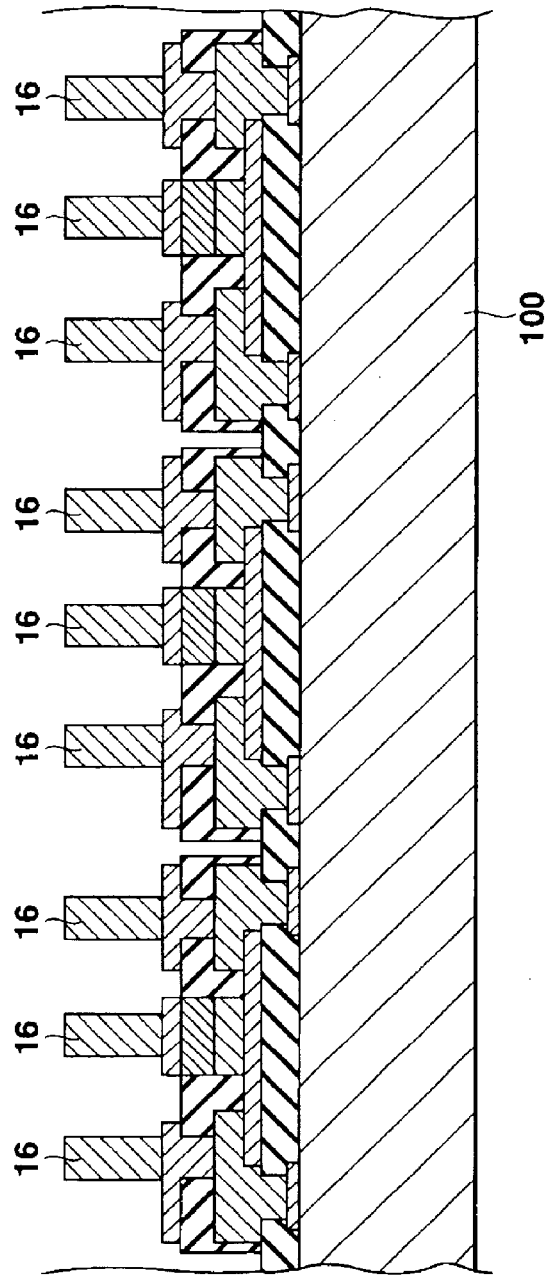
FIG.7
FIG.8

SEMICONDUCTOR DEVICE

CROSS-REFERENCE TO RELATED APPLICATIONS

This application is based upon and claims the benefit of priority from the prior Japanese Patent Applications No. 2000-243765, filed Aug. 11, 2000; and No. 2000-243783, filed Aug. 11, 2000, the entire contents of both of which are incorporated herein by reference.

BACKGROUND OF THE INVENTION

1. Field of the Invention

The present invention relates to a semiconductor device of a CSP (Chip Size Package) structure and a method of manufacturing the same.

2. Description of the Related Art

In recent years, a semiconductor device of a CSP structure, in which the chip size is substantially equal to the package size, has come to be employed for increasing the mounting density of the circuit substrate. FIG. 40 is a cross sectional view exemplifying the construction of a semiconductor device of a CSP structure, and FIG. 41 is a cross sectional view along the line V—V shown in FIG. 40 showing the construction of the semiconductor device excluding a conductor layer 5.

As shown in the drawings, the semiconductor device 10 comprises a plurality of connection pads 2 formed of aluminum electrodes or the like and formed on the front side (circuit side) of a semiconductor substrate 1. A passivation film 3 consisting of silicon oxide, silicon nitride or the like is formed on the side of the upper surfaces of the substrate 1 and the connection pads 2 in a manner to expose the central portion of each of the connection pads 2. Also, a circuit element-forming region DA is formed on the front surface of the semiconductor substrate 1 except the forming region of the connection pads 2, and circuit elements are formed in an integrated manner within the circuit element-forming region DA.

A protective film 4 is formed on the passivation film 3 in a manner to form an open portion in the central portion of each connection pad 2. For forming the protective film 4, the entire surface on the side of the circuit of the semiconductor substrate 1 is coated with, for example, a polyimide series resin material, followed by curing the coated resin material. Then, a resist patterning and a protective film patterning are applied by using an etching solution, followed by peeling off the resist film so as to form the protective film 4.

Conductive layers 5 each electrically connected to the connection pad 2 are formed on the protective film 4, a plurality of posts 6 for connection to the external circuit, which are columnar electrodes are formed in predetermined positions on the conductor layers 5. As described herein later, a metallizing treatment such as a solder printing is applied to the tip of the post 6 so as to form a metallized projecting edge surface 6a that is to be connected to a terminal (not shown) on the circuit substrate. Also, the post 6 is formed straight in a height of at least 50 μm and typically about 100 to 150 μm so as to absorb the stress generated by the difference in the thermal expansion coefficient between the semiconductor substrate 1 and the circuit substrate.

A sealing film 7 made of a resin material such as a polyimide resin or an epoxy resin is formed on that portion of the entire circuit surface of the semiconductor substrate 1 which is positioned between the adjacent posts 6. As described above, a native oxide film is removed from the projecting edge surface 6a of the post 6, followed by applying a metallizing treatment such as a solder printing to the projecting edge surface 6a so as to form a terminal portion for connection to the external circuit. Where the semiconductor device of the construction described above is mounted to a circuit substrate, the terminal portion of the post 6 for the connection to the external circuit is arranged to face the terminal of the circuit substrate and bonded by, for example, a soldering to the terminal of the circuit substrate so as to achieve the mounting of the semiconductor device to the circuit substrate.

For forming a transceiver chip equipped with a wireless I/F function such as Bluetooth, it is absolutely necessary for the semiconductor chip to be equipped with an RF functional elements such as a PLL circuit, a VCO circuit or a filter circuit. For realizing these RF functional elements, it is necessary to arrange various passive elements such as a capacitance element and an inductance element in the circuit element-forming region DA of the semiconductor substrate 1.

However, the formation of these passive elements necessitates a relatively large area, with the result that, if these passive elements are to be formed in the circuit element-forming region DA, the chip area is unavoidably increased. If the chip area is increased in the semiconductor device 10 of the CSP structure described above, various problems are generated. For example, it is impossible to increase the mounting density on the circuit substrate. Also, the number of chips that can be obtained from a single semiconductor wafer is decreased so as to lower the yield of manufacture and to increase the manufacturing cost.

Such being the situation, the various passive elements for realizing the RF functional elements are formed as discrete parts and mounted on the outside of the chip. However, it is difficult to decrease the size of the RF module with such a system.

BRIEF SUMMARY OF THE INVENTION

An object of the present invention is to provide a semiconductor device capable of mounting passive elements on a chip without inviting the increase in the chip area and a method of manufacturing the particular semiconductor device.

According to a first aspect of the present invention, which is intended to achieve the above-noted object, there is provided a semiconductor device comprising a semiconductor substrate having a circuit element-forming region and a plurality of connection pads formed therein; an insulating film formed on the circuit element-forming region; and at least one thin film passive element including a columnar electrode for connection to the external circuit connected to at least one of a plurality of connection pads and at least one capacitance element consisting of a plurality of conductive layers and dielectric material layers and an inductance element consisting of a conductive film patterned in the shape of generating an inductance component, the capacitance element and the inductance element being formed on the insulating film on the circuit element region.

It is possible for the thin film passive element to be arranged in various types on the circuit element-forming region DA so as to be connected to the circuit element of the circuit element-forming region DA through the connection pads or so as to be connected to the external connection terminals through the columnar electrodes. As a result, it is possible to mount the thin film passive elements in a stacked fashion without inviting an increase in the chip area. Also, the passive elements, which were required to be mounted outside the chip as discrete parts, can be mounted within the chip so as to decrease the module size.

According to a second aspect of the present invention, which is intended to achieve the above-noted object, there is provided a method of manufacturing a semiconductor device of the particular construction described above. In the manufacturing method of the present invention, a semiconductor wafer having a plurality of chip forming regions is prepared first. A connection pad is formed in each of the chip forming regions. After a passivation film exposing the central portion of each connection pad is formed on the upper surfaces of the connection pads formed in the chip forming regions, a first protective film is formed on the upper surface of the passivation film. Where a capacitance element is formed as the thin film passive element, a first conductive layer connected to the connection pad is formed on the first protective film, and a dielectric material layer is formed on that portion of the first conductive film in which the capacitance element is formed, followed by forming a second conductive film on the dielectric material layer so as to form the capacitance element. Alternatively, it is also possible to arrange the first conductive layers adjacent to each other with the dielectric material layer interposed therebetween so as to form the capacitance element having the dielectric material layer sandwiched between the adjacent conductive layers, thereby decreasing the number of steps required for forming the capacitance element. On the other hand, in the case of forming an inductance element as the thin film passive element, a first conductive layer connected to a connection pad is formed on the first protective layer, and a conductive layer patterned in a shape adapted for generating an inductance component such as an angular eddy shape or a loop shape is formed so as to form the inductance element. It is also possible to form a magnetic film on the conductive layer forming the inductance element with the protective film interposed therebetween. In this case, it is possible to increase the inductance value of an inductance element. After these steps, dicing is applied to each chip forming region so as to separate the semiconductor wafer into individual semiconductor devices, thereby forming a plurality of semiconductor devices of the present invention each having at least one thin film passive element. As a result, it is possible to collectively form a plurality of semiconductor devices having a plurality of thin film passive elements stacked on a chip.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIGS. 3 to 10 are cross sectional views collectively showing a method of manufacturing a semiconductor device according to a first embodiment of the present invention;

DETAILED DESCRIPTION OF THE INVENTION

The construction and the manufacturing method of a semiconductor device of the present invention will now be described in detail with reference to the accompanying drawings showing preferred embodiments of the present invention.

<First Embodiment>

Figure 1:
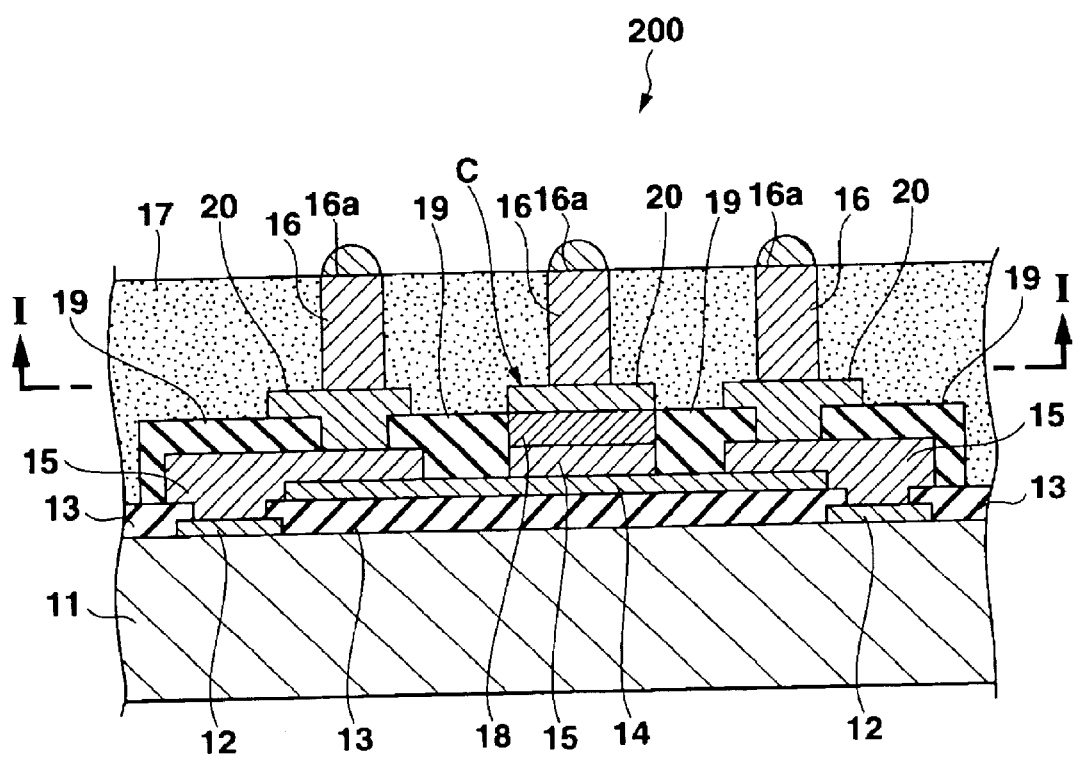
FIG. 1 is a cross sectional view showing the construction of a semiconductor device according to a first embodiment of the present invention.
Figure 2A:
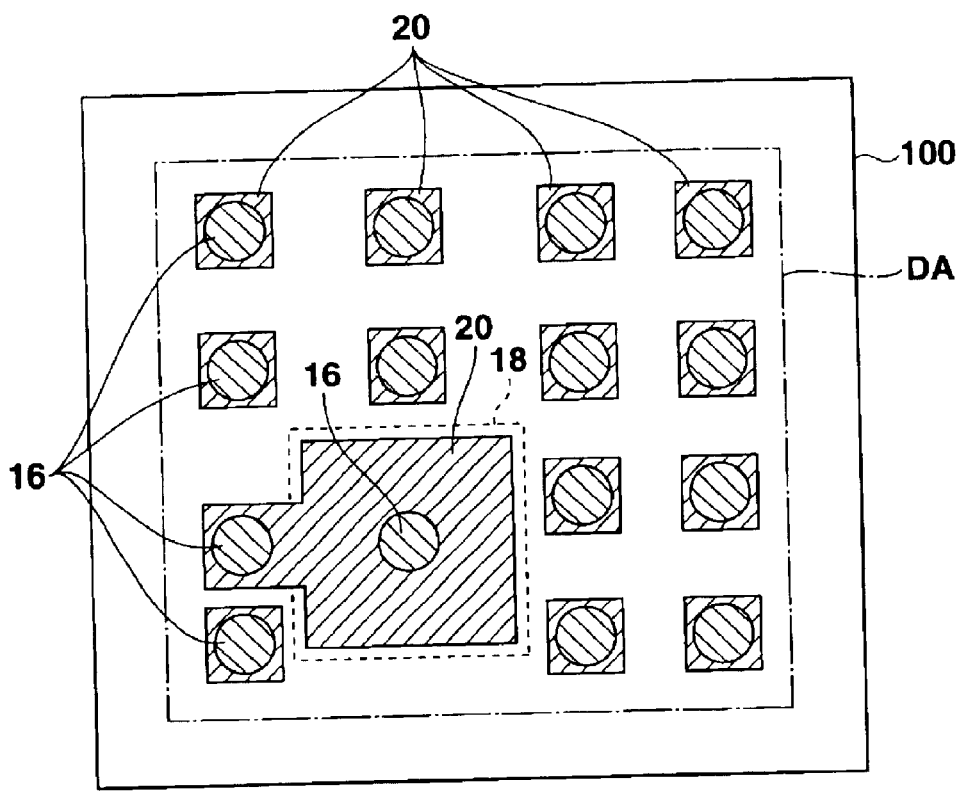
FIG. 2A is a cross sectional view along the line I—I shown in FIG. 1 showing a first example of the gist portion of the semiconductor device.
Figure 2B:
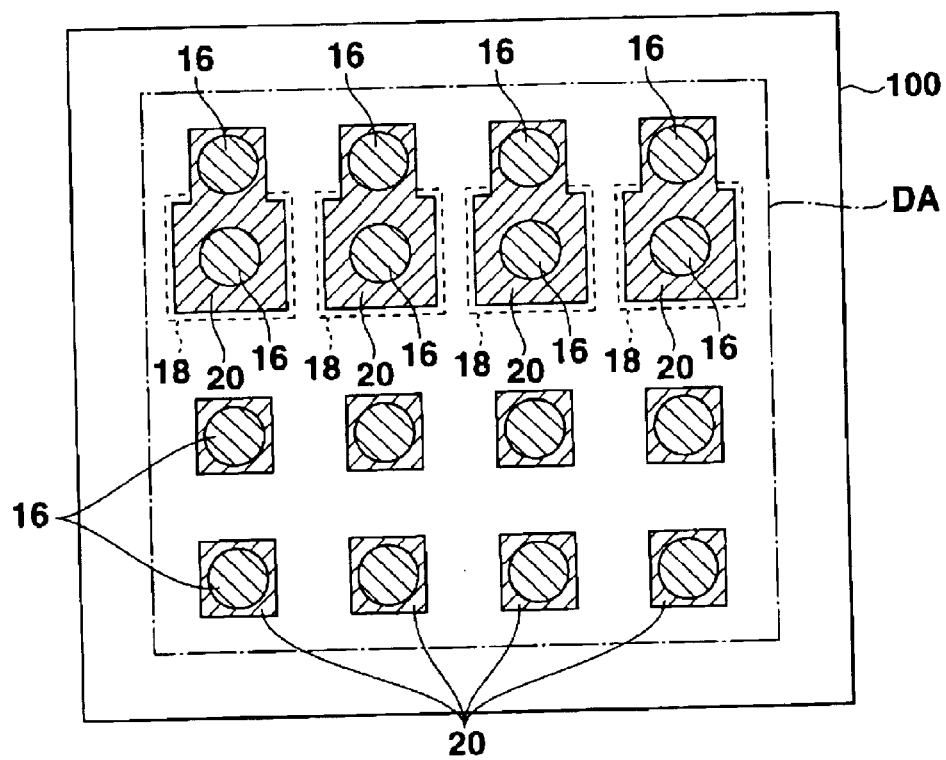
FIG. 2B is a cross sectional view along the line I—I shown in FIG. 1 showing a second example of the gist portion of the semiconductor device.

FIG. 1 is a cross sectional view showing a semiconductor device 200 according to a first embodiment of the present invention. Also, FIGS. 2A and 2B show the gist portions of the semiconductor device in the cross section along the line I—I shown in FIG. 1 except a sealing film 17.

Figure 40:
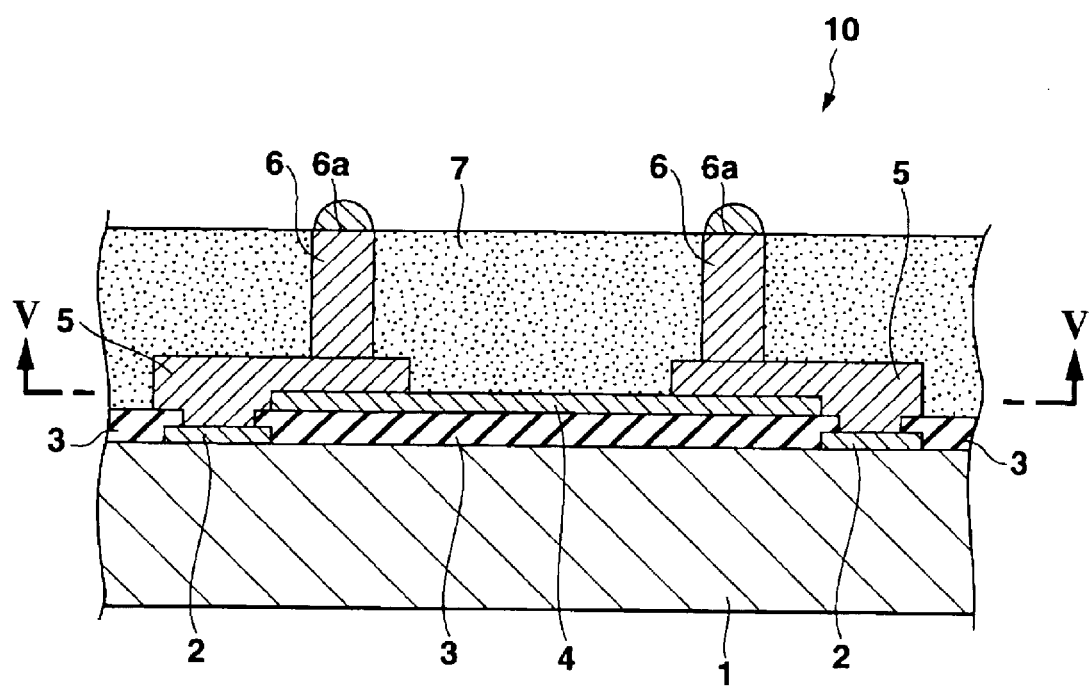
FIG. 40 is a cross sectional view showing the construction of a conventional semiconductor device.
Figure 41:
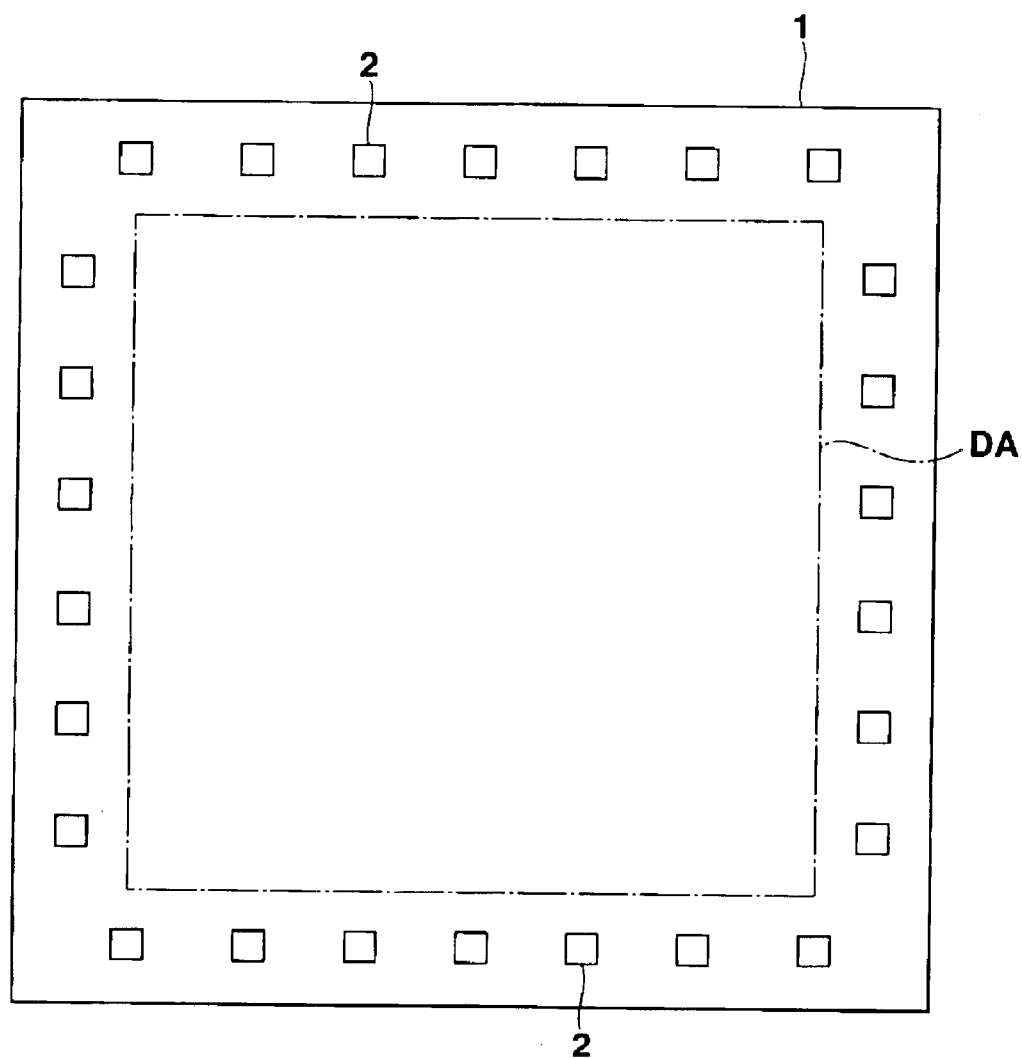
FIG. 41 is a cross sectional view of the conventional semiconductor device along the line V—V shown in FIG. 40.

The semiconductor device 200 according to the first embodiment of the present invention comprises a plurality of connection pads 12 consisting of, for example, aluminum electrodes formed to surround a circuit element-forming region DA on the front side (circuit side) of a semiconductor substrate 11, a passivation film 13 consisting of silicon oxide or silicon nitride and formed on the side of the upper surface of the connection pads 12 in a manner to expose the central portion of each of the connection pads 12, and a protective film 14 formed on the upper surface of the passivation film 13, hereinafter referred to as a first protective film 14, like the conventional semiconductor device 10 shown in FIGS. 40 and 41. A conductive layer 15 (hereinafter referred to as first conductive layer 15) connected to the connection pad 12 is formed on the first protective film 14.

The semiconductor device 200 according to the first embodiment of the present invention also comprises a plurality of conductive layers 20, hereinafter referred to as second conductive layers 20, formed above the first conductive layers 15 and a plurality of dielectric material layers 18 interposed between the first conductive layers 15 and the second conductive layers 20. What should be noted is that the semiconductor device 200 according to the first embodiment of the present invention is featured in that these first and second conductive layers 15, 20 and the dielectric material layers 18 interposed between the first and second conductive layers 15 and 20 collectively form capacitance elements C providing a plurality of thin film passive elements. The thin film passive element represents a passive element formed on the first protective layer 14 and including at least one conductive layer in the form of a thin film. To be more specific, the thin film passive element represents a capacitance element in the first embodiment of the present invention and in the second to third embodiments described herein later and an inductance element in each of the fourth to sixth embodiments of the present invention described herein later. What should be noted is that the thin film passive element is combined with, for example, a circuit element in the circuit element-forming region DA so as to constitute a wireless I/F function. Also, the thin film passive element in the present invention is not limited to those exemplified above and includes, for example, a thin film transformer, a thin film SAM (Surface Acoustic Wave) filter, a micro strip line, and an MMIC (Microwave Monolithic Integrated Circuit).

Also, a plurality of straight-shaped posts 16 or columnar electrodes for connection to the external circuit, which are equal to those included in the conventional semiconductor device shown in FIGS. 40 and 41, are formed in predetermined positions on the conductive layers 20. Also, the post 16 is formed in a height of at least 50 µm and typically about 100 to 150 µm.

Further, a protective film 19, hereinafter referred to as a second protective film 19, is formed to surround the capacitance element C so as to electrically insulate the capacitance element C from the other members of the semiconductor device.

Incidentally, where the dielectric material layer 18 is not formed between the first conductive layer 15 and the second conductive layer 20 and, thus, the capacitance element C is not formed, the post 16 is formed on the first conductive layer 15 with the second conductive layer 20 interposed therebetween.

The sealing film 17 consisting of a resin material such as a polyimide resin or an epoxy resin is formed between the adjacent posts 16, and an oxide film is removed from the edge surface 16a of the post 16 and a metallizing treatment such as a solder printing is applied to the exposed edge surface 16a so as to form a terminal portion for connection to the external circuit.

The capacitance value of the capacitance element C formed by the resultant structure is determined by the relative dielectric constant, thickness and area of the dielectric material forming the dielectric material layer 18. The dielectric material forming the dielectric material layer 18 includes, for example, barium titanate and tantalum titanate.

The capacitance element C formed in the circuit element-forming region DA of the semiconductor substrate 11 by the construction described above can be arranged in various modes, as required. For example, as shown in FIG. 2A, it is possible to increase the area of the single dielectric material layer 18 so as to form the capacitance element C of a large capacitance as shown in FIG. 2A. Alternatively, it is also possible to arrange a plurality of capacitance elements C on the semiconductor substrate 11, as shown in FIG. 2B.

FIGS. 3 to 10 are cross sectional views collectively showing a method of manufacturing the semiconductor device 200 according to the first embodiment of the present invention. The manufacturing method of the semiconductor device 200 will now be described with reference to these drawings.

Incidentally, in the manufacturing method of the semiconductor device according to various embodiments of the present invention, a wiring layer, a capacitance element, an inductance element, etc. are formed on a semiconductor wafer 100, followed by finally dividing the semiconductor wafer 100 for each chip so as to form the semiconductor substrate 11, thereby manufacturing the semiconductor device 200, as described herein later.

Figure 3:
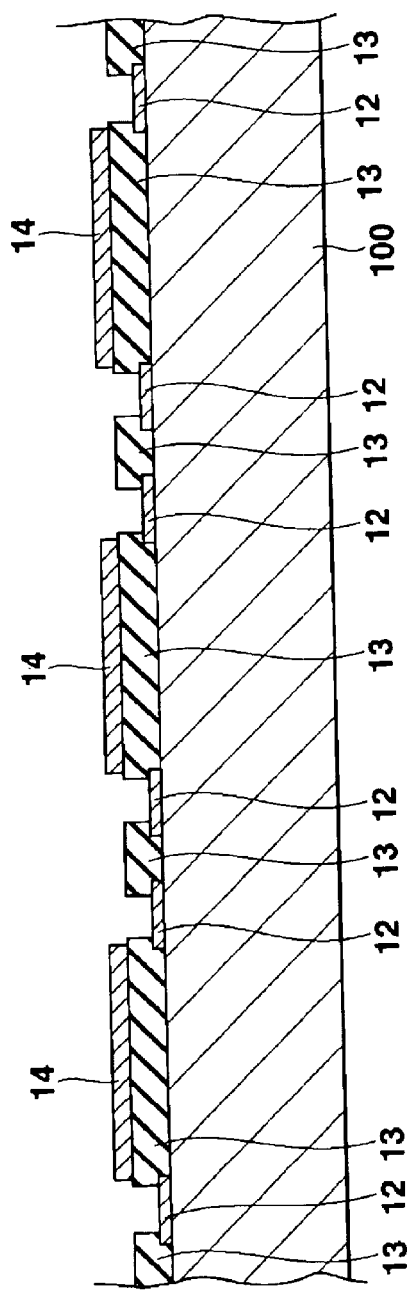

In the manufacturing method according to the first embodiment of the present invention, a passivation film 13 consisting of, for example, silicon oxide or silicon nitride is formed first on the side of the upper surfaces of a plurality of connection pads 12 consisting of, for example, aluminum electrodes formed in the chip-forming regions on the circuit side of the semiconductor wafer 100, as shown in FIG. 3. Then, a first protective film 14 is formed on the upper surface of the passivation film 13 in a manner to form an opening in the central portion of each of the connection pads 12. The first protective film 14 is formed by, for example, coating the entire surface on the side of the circuit of the semiconductor wafer 100 with a polyimide series resin material and curing the coated resin material, followed by applying a resist patterning and a protective film patterning by using an etching solution and subsequently peeling off the resist. It is also possible to employ a printing method using a squeegee or a coating method utilizing an ink ejection from a nozzle for forming the first protective film 14. Also, the material of the protective film is not limited to the polyimide series resin material. Specifically, an epoxy series resin material, PBO (benzaoxidole series), etc. can also be used as the material of the protective film.

Figure 4:
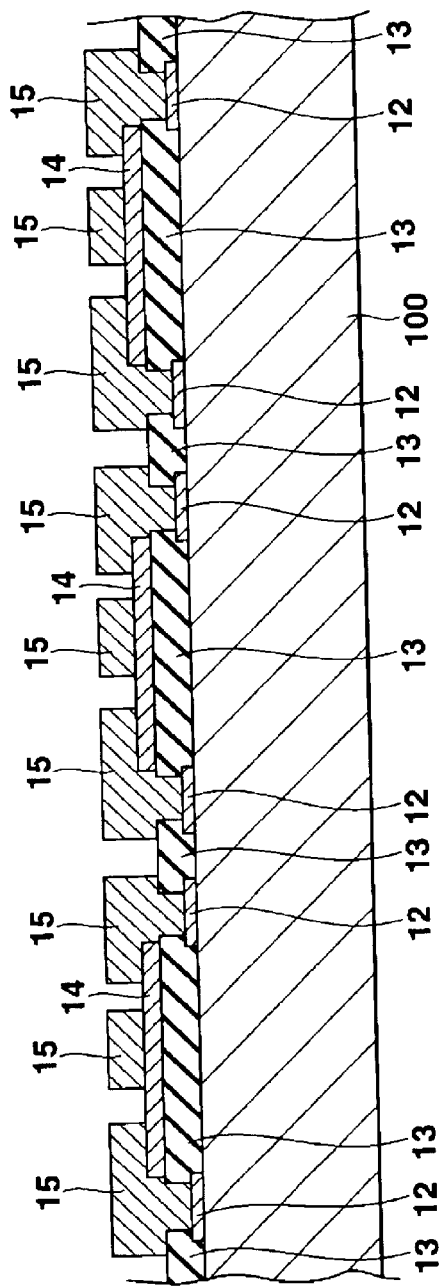

Then, a first conductive layer 15 is formed on the connection pads 12 exposed via the open portions formed in the first protective film 14 and the first protective films 14, as shown in FIG. 4. For forming the first conductive layer 15, a UBM (under bump metal) layer (not shown) is deposited by, for example, a sputtering method on the entire surface of the first protective film 14 including the exposed surfaces of the connection pads 12, followed by coating and curing a photoresist film for an conductive layer. Then, the cured photoresist film is patterned by a photolithography technology to form openings of a predetermined shape, followed by applying an electroplating to the portion opened by the resist, thereby forming the first conductive layer 15.

It is also possible to employ an electroless plating method for forming the first conductive layer 15. The wiring material used for forming the conductive layer includes, for example, copper, aluminum and gold having good conductive properties.

In the next step, a dielectric material layer 18 is formed in a capacitance element-forming region on the first conductive layer 15, as shown in FIG. 5. The dielectric material layer 18 can be formed by, for example, forming a resist pattern, followed by depositing a dielectric material layer in a predetermined thickness by a sputtering method.

Then, a second protective film 19 serving to electrically isolating the dielectric material layer from the other layers is formed, followed by patterning the second conductive layer 19 to form openings in the portion where a second conductive layer 20 is to be formed and the portion where to the cutting for the dicing is applied, as shown in FIG. 6. The second protective film 19 can be formed as in the formation of the first protective layer 14. Specifically, after the entire surface on the side of the circuit of the semiconductor wafer 100 is coated with, for example, a polyimide series resin material and the resin material coating is cured, a resist patterning and a protective film patterning are applied to the cured resin material by using an etching solution and subsequently peeling off the resist layer.

In the next step, the second conductive layer 20 is formed so as to form a conductive portion electrically connected to the first conductive layer 15 exposed via the opening formed in the second protective film 19 and also electrically connected to the dielectric material layer 18 formed on the upper surface of the first conductive layer 15 so as to form a conductive layer portion forming a capacitance element, as shown in FIG. 7. The second conductive layer 20 can be formed by forming a resist pattern first, followed by applying an electroplating as in the formation of the first conductive layer 15.

Then, a plurality of posts 16 or columnar electrodes are formed in predetermined positions on the conductive layers 20, as shown in FIG. 8. The posts 16 can be formed as in the conventional method. Specifically, a photoresist for forming the posts is coated in a thickness of about, for example, at least 50 µm, and typically 100 to 150 µm and, then, the coated photoresist is cured, followed by forming openings exposing predetermined positions of the second conductive layer 20 and subsequently applying an electroplating to the openings thus formed. It is also possible to employ an electroless plating or a stud bump method for forming the posts 16. The materials used for forming the posts 16 include, for example, copper, solder, gold and nickel having good conductive properties. Where a solder is used as a material for forming the post 16, it is possible to form a spherical electrode by applying a reflow treatment after the soldering step. Also, in the case of forming the post 16 by using a solder material, it is also possible to employ a printing method in addition to the methods pointed out above.

Figure 9:
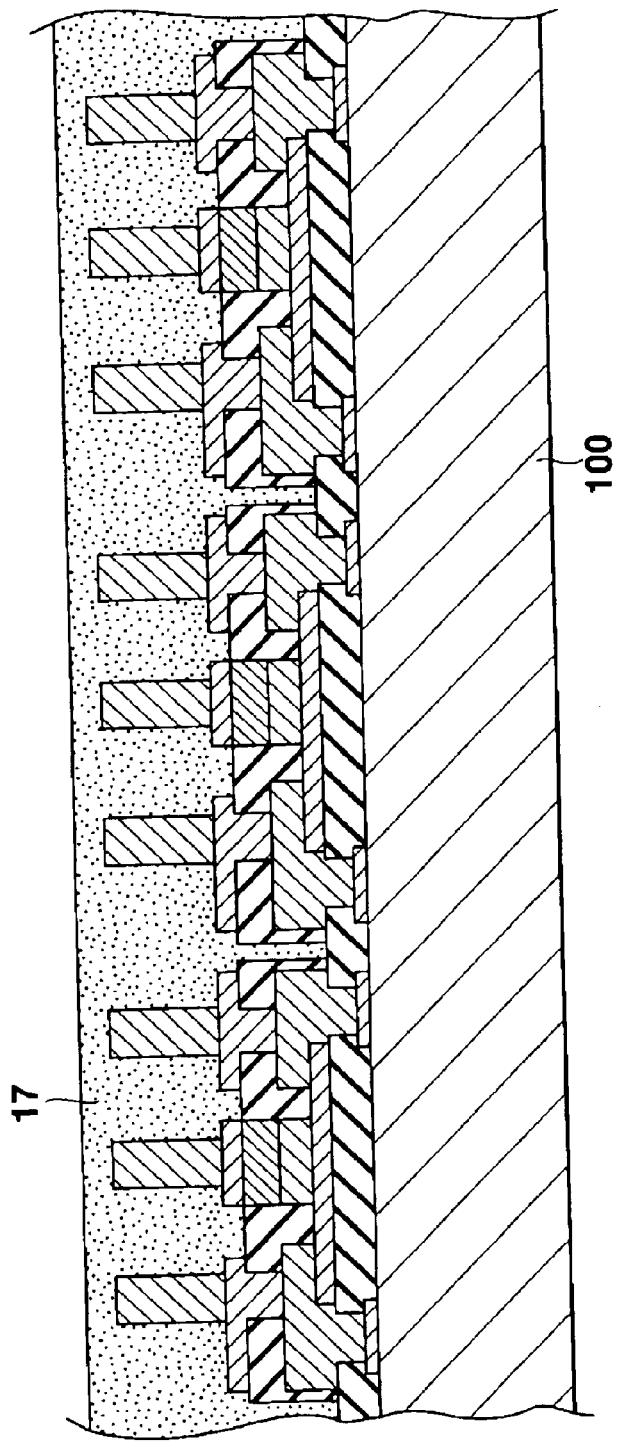

In the next step, a sealing film 17 is formed on the entire front surface on the front side (circuit side) of the semiconductor wafer 100 in a manner to cover the posts 16 by, for example, a molding method by using a resin material such as a polyimide resin or an epoxy resin, as shown in FIG. 9. It is desirable to form the sealing film 17 by using a resin material substantially equal in the main component to the resin material used for forming the first protective film 14 and the second protective film 19 in order to ensure a reliability relative to the change in the environment. Incidentally, it is also possible to employ, for example, a printing method, an immersion method, a spin coating method and a die coating method for forming the sealing film 17.

Figure 10:
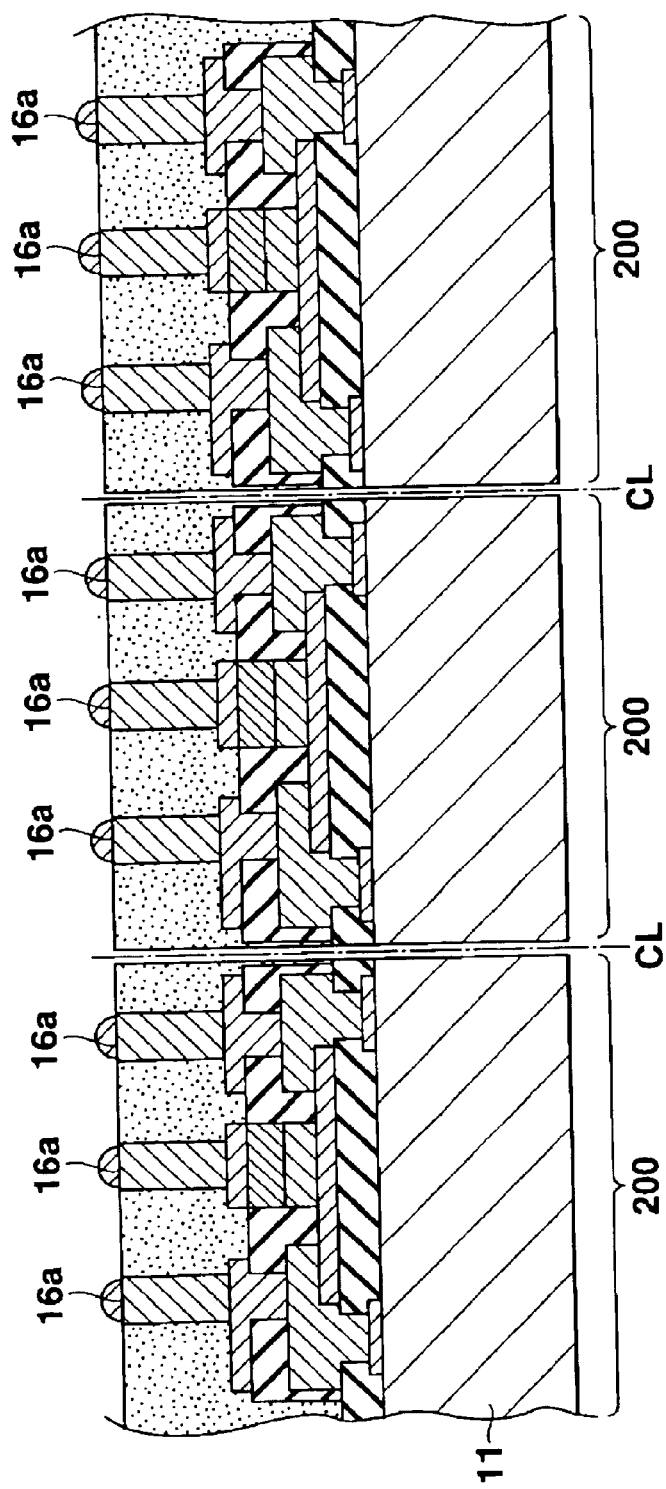

Further, the upper surface of the sealing film 17 is polished and cut so as to expose the edge surface 16a of the post 16, followed by removing an oxide film from the surface of the edge surface 16a and applying a metallizing treatment such as a solder printing treatment to the edge surface 16a of the post 16, as shown in FIG. 10.

Then, a dicing is applied along predetermined cut lines CL corresponding to the chip-forming regions so as to divide the semiconductor wafer 100 into the individual chip-forming regions and, thus, to form the individual semiconductor substrates 11, thereby forming the semiconductor device 200 shown in FIG. 1.

In the semiconductor device 200 of the construction described above, one or more capacitance elements are formed in the circuit element-forming region DA. Thus, it is possible to arrange the capacitance elements in various modes on the circuit element-forming region DA in accordance with the modes of arrangement of the second conductor layer re-wiring 20 and the posts 16. FIGS. 11A to 15A are cross sectional views showing the connection modes of the capacitance elements C in accordance with the modes of arrangement of the second conductive layer 20 and the posts 16 in the semiconductor device 200, and FIGS. 11B to 15B show the corresponding equivalent circuit diagrams.

Figure 11A:
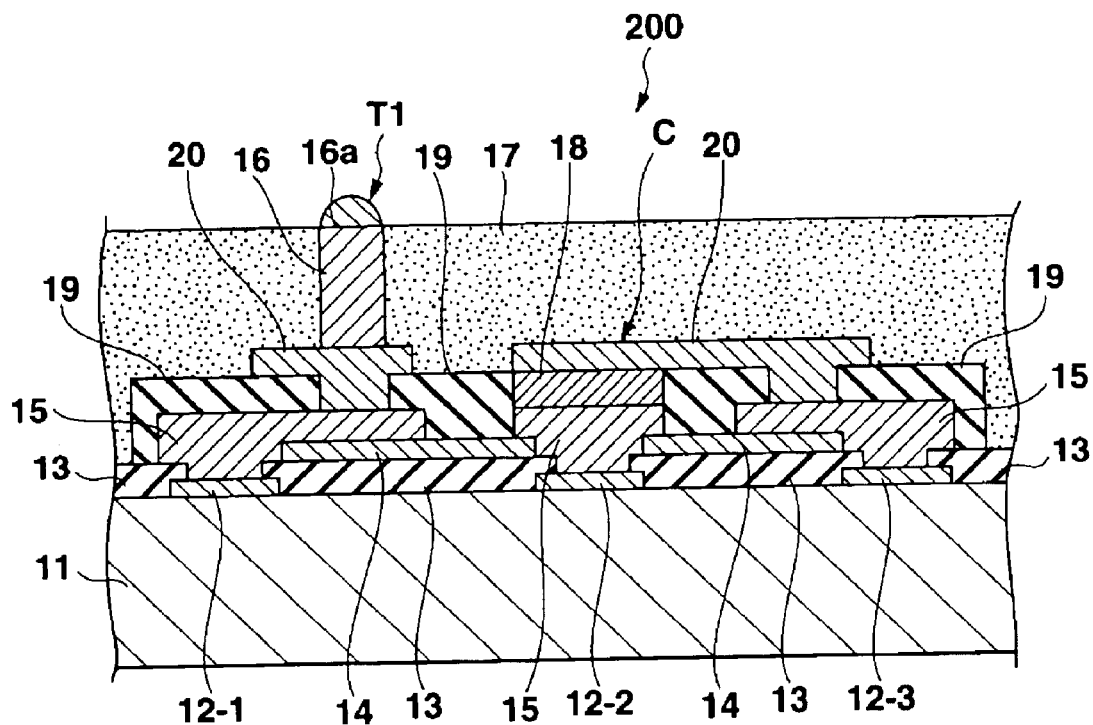
FIG. 11A is a cross sectional view showing a first connection mode of a capacitance element according to the first embodiment of the present invention.

FIG. 11A shows the first connection mode of the capacitance element in the first embodiment of the present invention, covering the case where the dielectric material layer 18 is formed on the first conductive layer 15 connected to the connection pad 12-2, and the second conductive layer 20 is stacked via the first conductive layer 15 connected to the connection pad 12-3 so as to form the capacitance element C, and the post 16 is not formed on the second conductive layer 20 forming a capacitance element. The second conductive layer 20 is formed in direct contact with the first conductive layer 15 not involved in the formation of the capacitance element, and the post 16 is formed on the second conductive layer 20 so as to be connected to an external connection terminal T1.

Figure 11B:
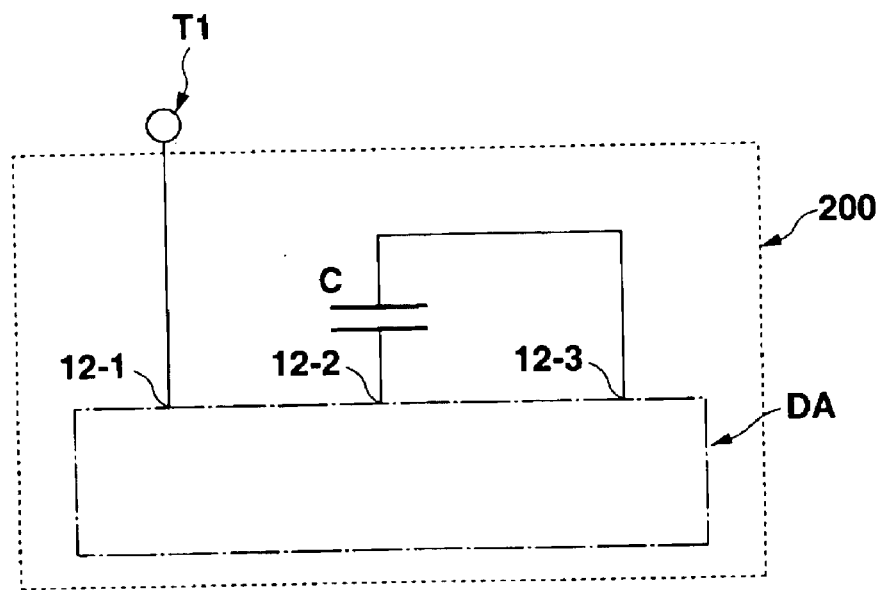
FIG. 11B is an equivalent circuit diagram corresponding to the connection mode of the capacitance element shown in FIG. 11A.

Concerning the equivalent circuit, both ends of the capacitance element C are connected to only the circuit element in the circuit element-forming region DA, as shown in FIG. 11B.

Figure 12A:
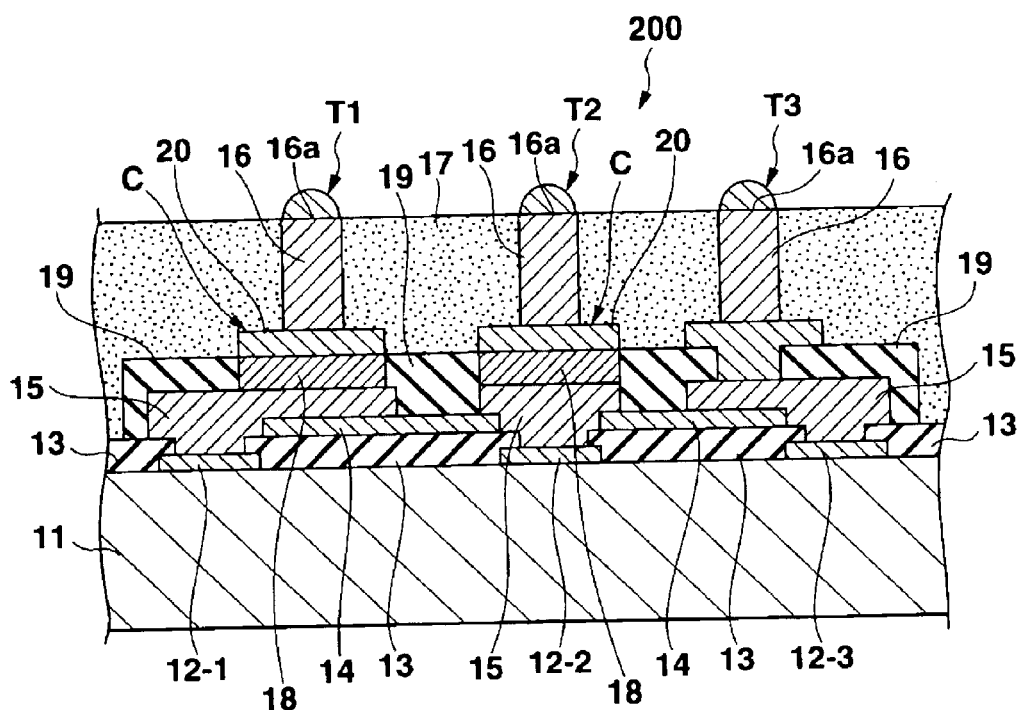
FIG. 12A is a cross sectional view showing a second connection mode of a capacitance element according to the first embodiment of the present invention.

FIG. 12A shows a second connection mode of the capacitance element in the first embodiment of the present invention, covering the case where the dielectric material layer 18 is formed on each of the first conductive layers 15 connected to the connection pads 12-1 and 12-2 and the second conductive layer 20 is stacked on each of these dielectric material layers 18 so as to form the capacitance element C, and the post 16 is formed on each of the second conductive layers 20 so as to be connected to each of the external connection terminals T1 and T2. Incidentally, the second conductive layer 20 is formed in direct contact with the first conductive layer 15 not involved in the formation of the capacitance element so as to be connected to an external connection terminal T3.

Figure 12B:
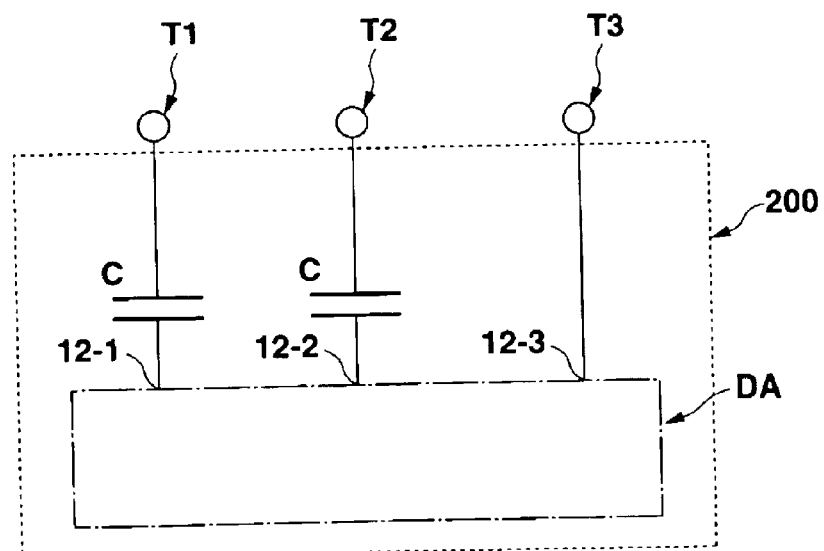
FIG. 12B is an equivalent circuit diagram corresponding to the connection mode of the capacitance element shown in FIG. 12A.

Concerning the equivalent circuit, one end of each of the capacitance elements C is connected to the circuit element in the circuit element-forming region DA, and the other ends of these capacitance elements C are connected to the external connection terminals T1 and T2, as shown in FIG. 12B.

Figure 13A:
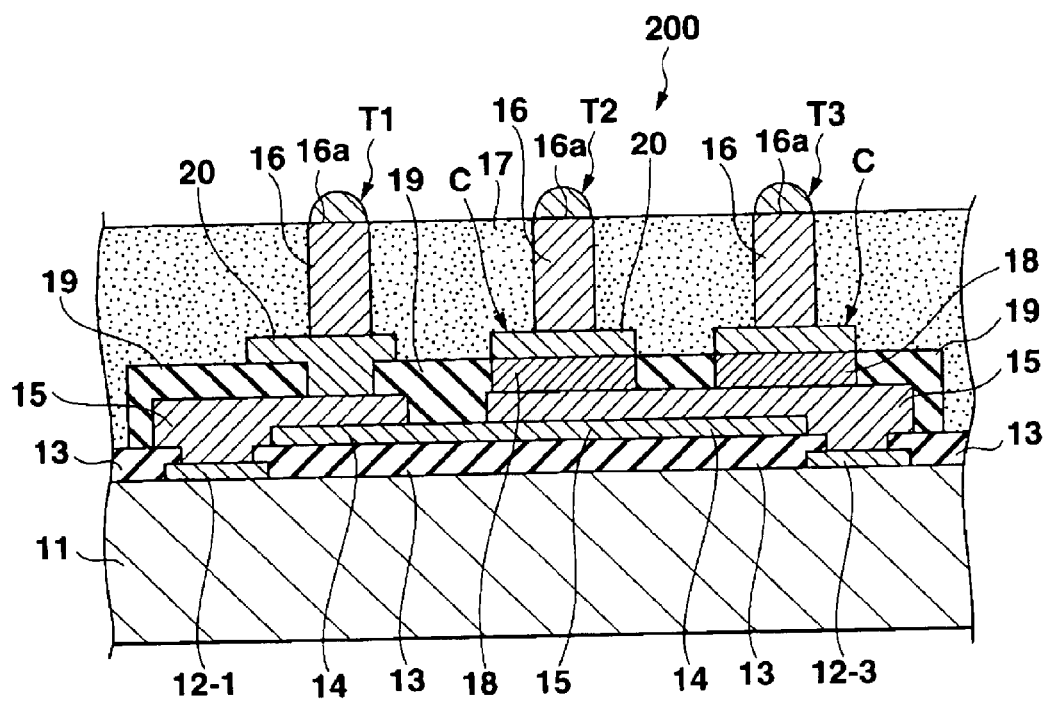
FIG. 13A is a cross sectional view showing a third connection mode of a capacitance element according to the first embodiment of the present invention.

FIG. 13A shows a third connection mode of the capacitance element in the first embodiment of the present invention, covering the case where the dielectric material layers 18 are formed in two points on the first conductive layer 15 connected to the connection pad 12-3 and the second conductive layers 20 are stacked on these dielectric layers 18 so as to form two capacitance elements C arranged in parallel, and the post 16 is formed on each of the second conductive layers 20 is formed so as to be connected to the external connection terminals T2 and T3. Incidentally, the post 16 is formed on the first conductive layer 15 not involved in the formation of the capacitance element via the second conductive layer 20 formed in direct contact with the first conductive layer 15 so as to be connected to the external connection terminal T1.

Figure 13B:
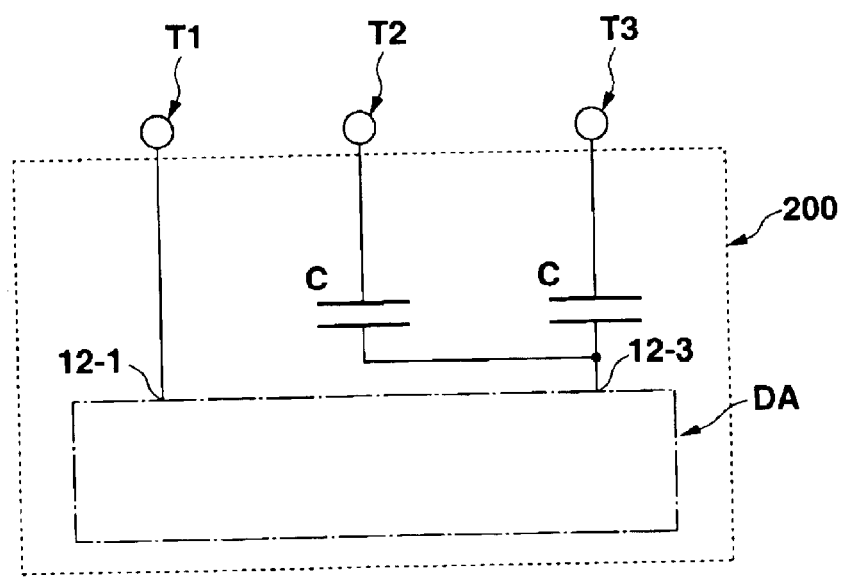
FIG. 13B is an equivalent circuit diagram corresponding to the connection mode of the capacitance element shown in FIG. 13A.

Concerning the equivalent circuit, one end of each of the two capacitance elements C is commonly connected to the circuit element in the circuit element-forming region DA, and the other ends of these capacitance elements C are connected to the external connection terminals T2 and T3, as shown in FIG. 13B.

Figure 14A:
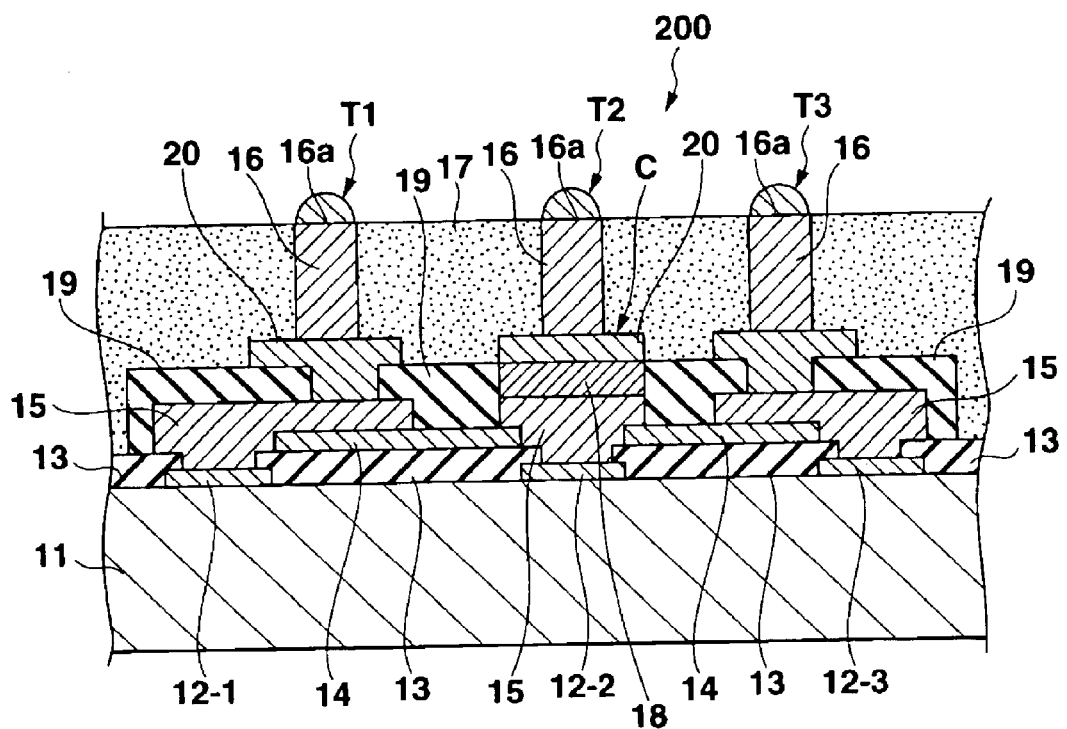
FIG. 14A is a cross sectional view showing a fourth connection mode of a capacitance element according to the first embodiment of the present invention.

FIG. 14A shows a fourth connection mode of the capacitance element in the first embodiment of the present invention, and covers the case where the dielectric material layer 18 is formed on the first conductive layer 15 connected to the connection pad 12-2 and the second conductive layer 20 is stacked on the dielectric material layer 18 so as to form the capacitance element C, and the post 16 is formed on the second conductive layer 20 so as to be connected to the external connection terminal T2. Incidentally, the posts 16 are formed on the first conductive layers 15, which are not involved in the formation of the capacitance element, with the second conductive layers 20 interposed therebetween, so as to be connected to the external connection terminals T1 and T2.

Figure 14B:
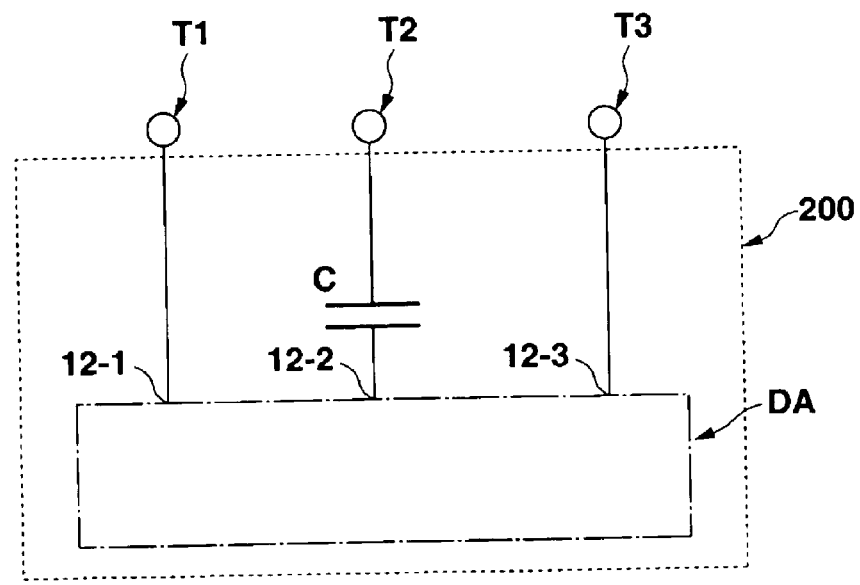
FIG. 14B is an equivalent circuit diagram corresponding to the connection mode of the capacitance element shown in FIG. 14A.

Concerning the equivalent circuit, one end of the capacitance element C is connected to the circuit element of the circuit element-forming region DA, with the other end being connected to the external connection terminal T2, as shown in FIG. 14B.

Figure 15A:
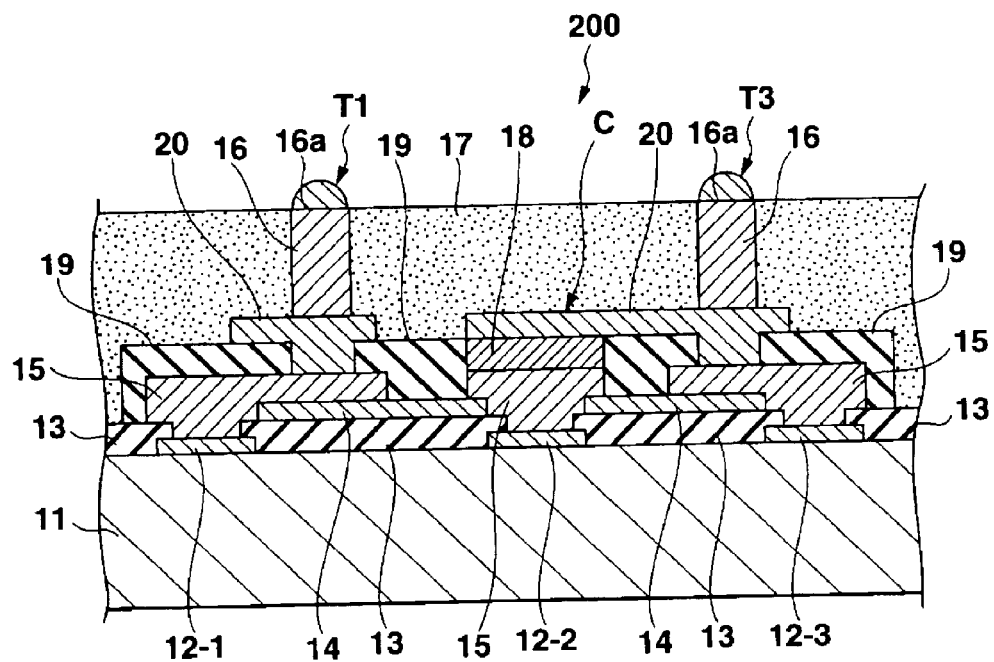
FIG. 15A is a cross sectional view showing a fifth connection mode of a capacitance element according to the first embodiment of the present invention.

FIG. 15A shows a fifth connection mode of the capacitance element in the first embodiment of the present invention, and covers the case where the dielectric material layer 18 is formed on the first conductive material layer 15 connected to the connection pad 12-2 and the second conductive layer 20, which is connected to the connection pad 12-3 via the first conductive layer 15, is stacked on the dielectric material layer 18 so as to form the capacitance element C, and the post 16 is formed on the second conductive layer 20 so as to be connected to the external connection terminal T3. Incidentally, the post 16 is formed on the first conductive layer 15, which is not involved in the formation of the capacitance element C, with the second conductive layer 20 interposed therebetween so as to be connected to the external connection terminal T1.

Figure 15B:
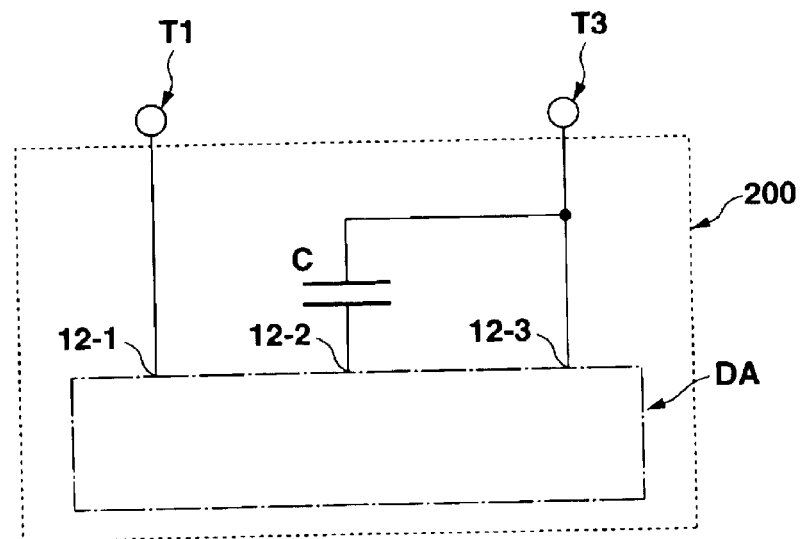
FIG. 15B is an equivalent circuit diagram corresponding to the connection mode of the capacitance element shown in FIG. 15A.

Concerning the equivalent circuit, one end of the capacitance element C is connected to the circuit element included in the circuit element-forming region DA and the other end of the capacitance element C is also connected to the circuit element of the circuit element-forming region DA and to the external connection terminal T3, as shown in FIG. 15B.

Needless to say, it is possible to employ the various connection modes shown in FIGS. 11A to 15A in a single apparatus in combination.

As described above, according to the first embodiment of the present invention, the capacitance element C is formed in the circuit element-forming region DA so as to form the capacitance element C in a three dimensional direction and to be capable of connection to the circuit element, making it possible to mount the capacitance element without inviting an increase in the chip area. It follows that it is possible to diminish the chip area. In addition, in the case of forming a module equipped with, for example, the wireless I/F function, the particular construction of the present invention contributes to the miniaturization of the module size because the capacitance element, which was required to be mounted outside the chip in the past, can be mounted within the chip.

Incidentally, in the first embodiment described above, the dielectric material layer 18 is of a single layer structure. However, it is also possible to prepare a stacked structure by alternately stacking, for example, the dielectric layers 18 and the second conductive layers 20 so as to form a plurality of capacitance elements. In this case, it is possible to connect the plural capacitance elements in parallel or in series by the patterns of the plural second conductive layers 20 that are alternately stacked.

Also, in order to suppress the influences given by the capacitance element to the other conductive layers, i.e., the influences such as the crosstalk caused by the stray capacitance and the parasitic capacitance, it is desirable to arrange a ground layer made of the material equal to that of the first conductive layer 15 or the second conductive layer 20 in a position in the vicinity of the plane flush with the first conductive layer 15 or the second conductive layer 20.

Further, in the first embodiment of the present invention, the dielectric material layer 18 is formed on the first conductive layer 15 for forming the capacitance element. Alternatively, it is possible to mix the dielectric material in, for example, the second protective film 19 to allow the second protective film 19 to also perform the function of the dielectric material layer 18.

<Second Embodiment>

Figure 16:
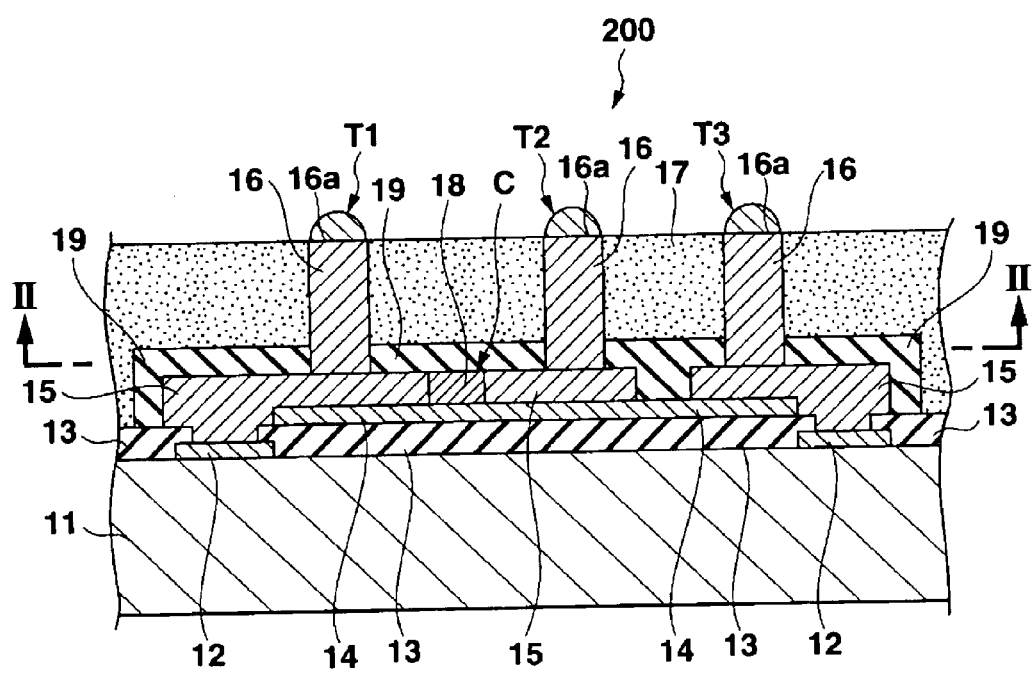
FIG. 16 is a cross sectional view showing the construction of a semiconductor device according to a second embodiment of the present invention.
Figure 17A:
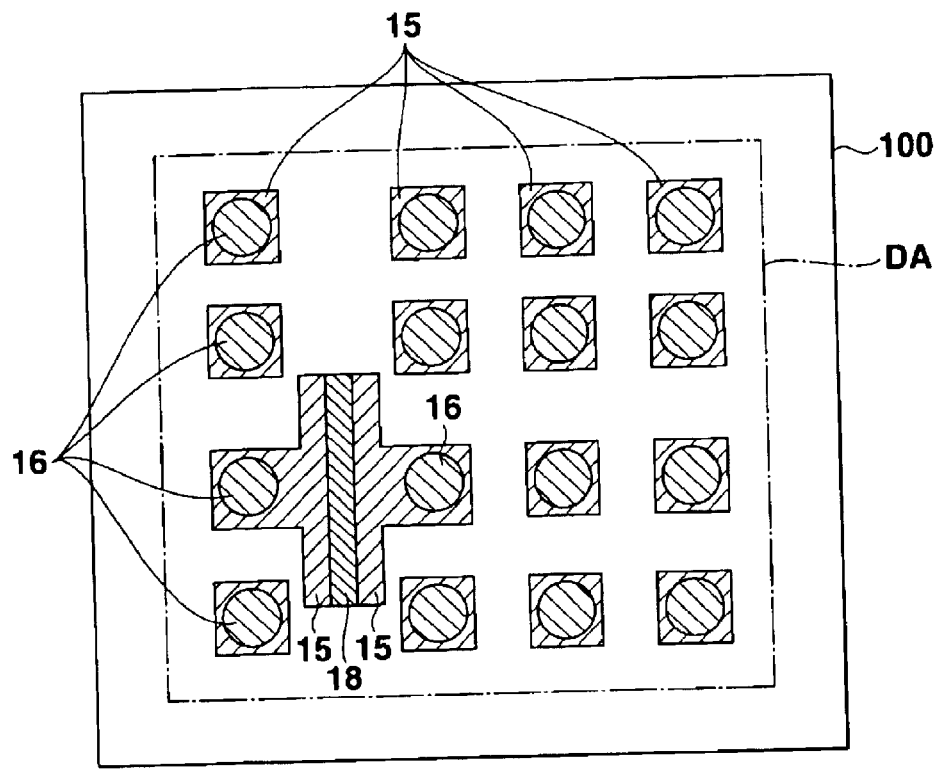
FIG. 17A is a cross sectional view along the line II—II shown in FIG. 16 showing a first example of the gist portion of the semiconductor device.
Figure 17B:
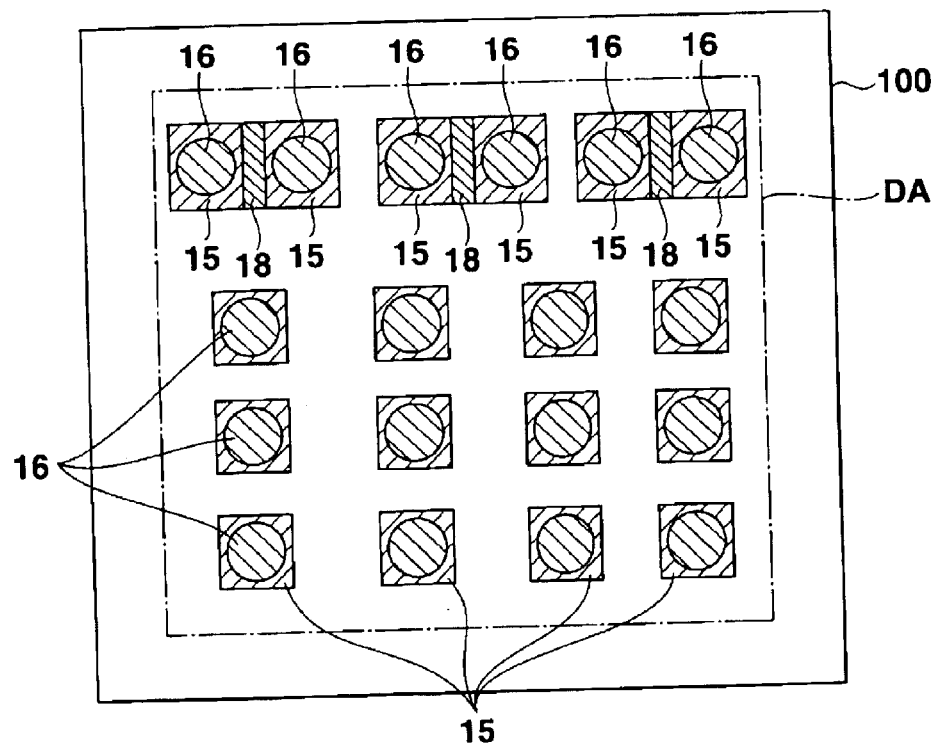
FIG. 17B is a cross sectional view along the line II—II shown in FIG. 16 showing a second example of the gist portion of the semiconductor device.

FIG. 16 is a cross sectional view showing a semiconductor device 200 according to a second embodiment of the present invention, and FIGS. 17A and 17B are cross sectional views along the line II—II shown in FIG. 16 showing the gist portions of the semiconductor device 200 excluding the sealing film 17.

Figure 18:
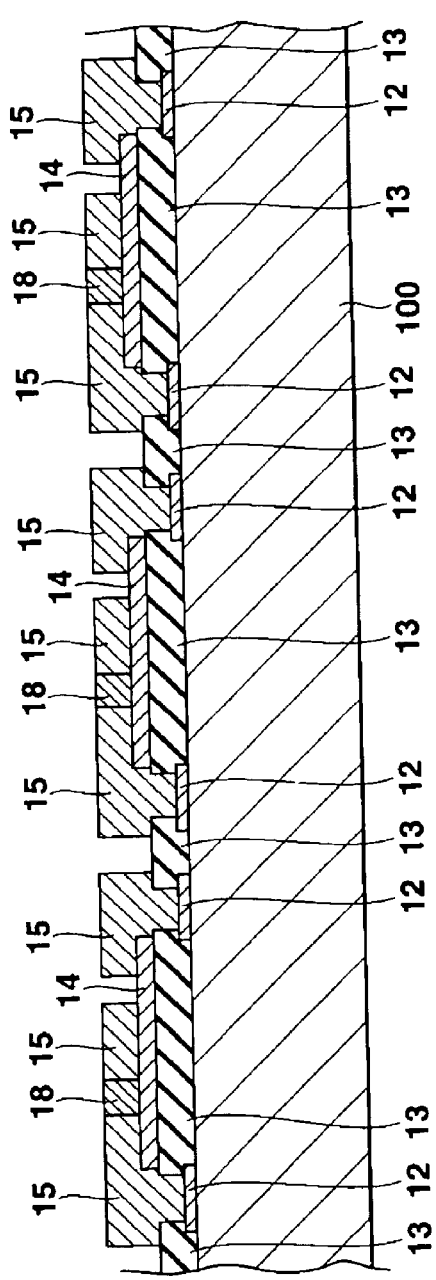
FIGS. 18 and 19 are cross sectional views collectively showing the manufacturing method of a semiconductor device according to the second embodiment of the present invention.
Figure 19:
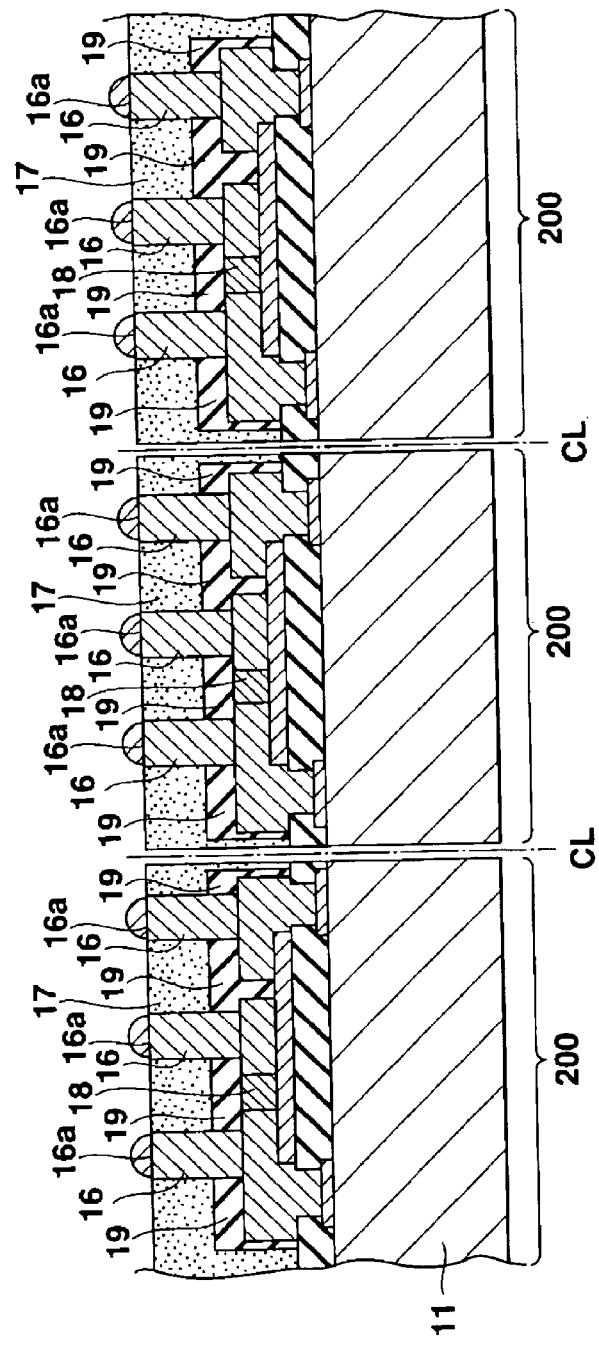

On the other hand, FIGS. 18 and 19 are cross sectional views showing the construction and the manufacturing process of the semiconductor device 200 according to the second embodiment of the present invention. In these drawings, the members of the semiconductor device common with those of the semiconductor device according to the first embodiment of the present invention described above are denoted by the same reference numerals so as to avoid the overlapping description.

In the second embodiment of the present invention, the conductive layers 15 are arranged a predetermined distance apart from each other on the first protective layer 14, and the dielectric material layer 18 is formed in the clearance between adjacent conductive layers 15 in a manner to abut against the edge surfaces of the conductive layer 15, as shown in FIG. 16. As a result, the capacitance element C is formed such that the dielectric material layer 18 is sandwiched between the edge surfaces acting as electrodes of the conductive layer 15. In other words, the capacitance element C is formed in a planar configuration. The posts 16 are formed on the conductive layers 15 so as to be connected to the external connection terminals T1 to T3.

The capacitance value of the capacitance element C of the construction described above is determined by the relative dielectric constant, thickness and area of the dielectric material forming the dielectric material layer 18, as in the first embodiment of the present invention described previously. The dielectric materials forming the dielectric material layer 18 include, for example, barium titanate and tantalum titanate.

The capacitance element C formed in a planar direction in the circuit element-forming region DA can be arranged in various modes. For example, as shown in FIG. 17A, it is possible to increase the areas of the edge surfaces of the conductive layer 15 and the dielectric material layer 18 so as to form the capacitance element having a large capacitance. It is also possible to arrange side by side a plurality of capacitance elements C as shown in FIG. 17B.

The manufacturing process of the semiconductor device 200 according to the second embodiment of the present invention will now be described with reference to FIGS. 18 and 19. The manufacturing process according to the second embodiment differs from the manufacturing process according to the first embodiment in that, in the second embodiment of the present invention, after a plurality of conductive layers 15 are arranged adjacent to each other on the first protective film 14, the dielectric material layer 18 is formed in the clearance between one end of the conductive layer 15 and the other end of the adjacent conductive layer 15, followed by forming the second conductive film 19.

To be more specific, in the manufacturing process according to the second embodiment of the present invention, a passivation film 13 is formed first on the upper surface of the connection pads 12 on the semiconductor wafer 100 in a manner to expose the central portion of each of the connection pads 12, followed by forming the first protective film 14 on the upper surface of the passivation film 13 in a manner to expose the central portion of each of the connection pads 12 as in FIG. 3 in the first embodiment, as shown in FIG. 18. Then, the conductive film 15 is formed on the connection pads 12 exposed by the openings formed in the first protective film 14. For forming the conductive layer 15, a UBM layer (not shown) is deposited by, for example, a UBM sputtering treatment on the entire surface of the first protective film 14, followed by coating of a photoresist for a conductive layer and curing the coated photoresist. Then, a patterning having openings of a predetermined shape is applied by a photolithography technology, followed by applying an electroplating to the portion opened by the resist, thereby forming the conductive layer 15. In this case, a clearance for forming the dielectric material layer 18 is formed between the adjacent conductive layers 15 on the first protective film 14. Then, the dielectric material layer 18 is formed in the clearance between the conductive layers 15.

The dielectric material layer 18 is formed by forming a pattern of, for example, a resist, followed by depositing a dielectric material in a predetermined thickness by a sputtering method.

In the next step, the second protective film 19 serving to electrically insulate the dielectric material layer 18 from the other layers is formed as in FIG. 6 in the first embodiment, as shown in FIG. 19, followed by forming the posts 16 electrically connected to the conductive layers 15 via the opening formed in the second protective film 19 as in FIG. 8 for the first embodiment. Then, the sealing film 17 is formed in a manner to cover the posts 16 as in FIGS. 9 and 10 for the first embodiment, followed by cutting and polishing the upper edge surface of the sealing film 17 so as to expose the edge surfaces 16a of the posts 16. Further, an oxide film is removed from the surface of the edge surface 16a, followed by applying a metallizing treatment such as a solder printing. Further, dicing is applied along the cut lines CL corresponding to the chip forming regions so as to divide the semiconductor wafer 100 into the individual chip forming regions, thereby forming the individual semiconductor substrates 11. In this fashion, it is possible to obtain the semiconductor device 200 of the construction shown in FIG. 16. As described above, in the second embodiment of the present invention, the capacitance element or elements are formed in a planar configuration, making it possible to decrease the number of process steps, compared with the first embodiment in which the capacitance element is formed in a three dimensional direction. It follows that it is possible to lower the manufacturing cost of the semiconductor device.

In the semiconductor device 200 of the construction described above, the capacitance element C is formed in a planar configuration such that the dielectric layer 18 is sandwiched between the adjacent pieces of the conductive layer 15. As a result, the capacitance element C can be connected to the circuit element in the circuit element-forming region DA in various modes in accordance with the modes of arrangement of the conductive layer 15 and the posts 16. FIGS. 20A to 23A are cross sectional views showing the connection modes of the capacitance element C in accordance with the modes of arrangement of the conductive layers 15 and the posts 16 in the semiconductor device 200. On the other hand, FIGS. 20B to 23B show the corresponding equivalent circuit diagrams.

Figure 20A:
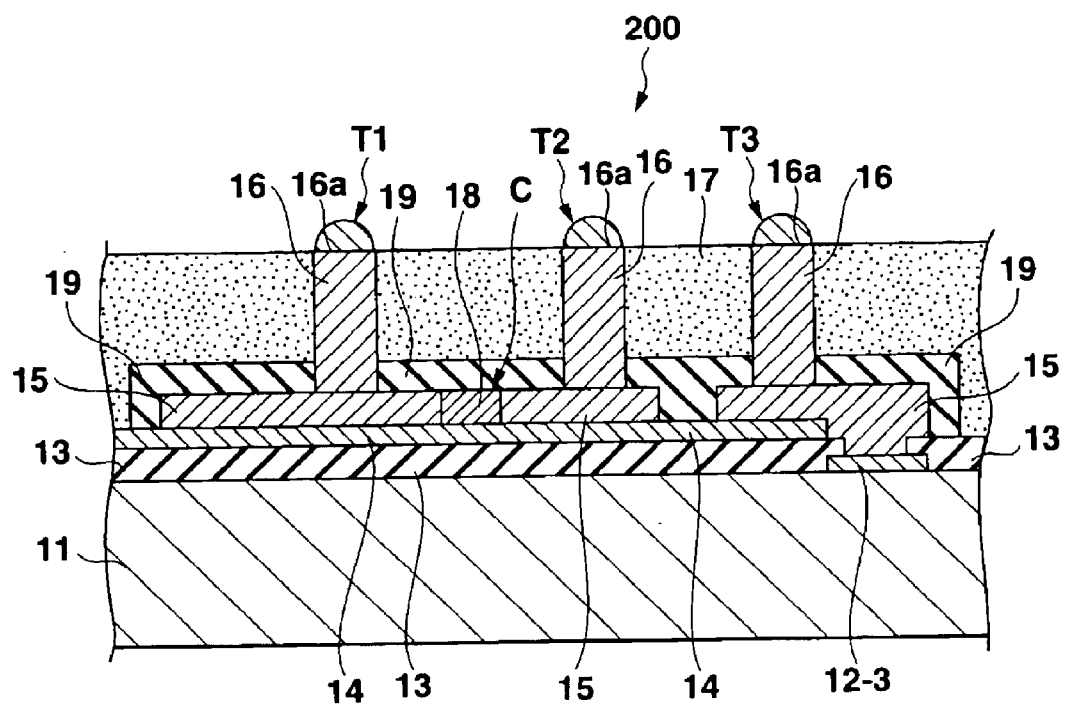
FIG. 20A is a cross sectional view showing a first connection mode of a capacitance element according to the second embodiment of the present invention.

FIG. 20A shows the first connection mode of the capacitance element in the second embodiment of the present invention, covering the case where the dielectric material layer 18 is formed in the clearance between the adjacent pieces of the conductive layer 15 so as to form the capacitance element C, and the post 16 is formed in each piece of the conductive layer 15 so as to permit the conductive layer 15 to be connected to the external connection terminals T1 and T2. Incidentally, the post 16 is formed on the piece of the conductive layer 15, which is not involved in the formation of the capacitance element, so as to be connected to the external connection terminal T3.

Figure 20B:
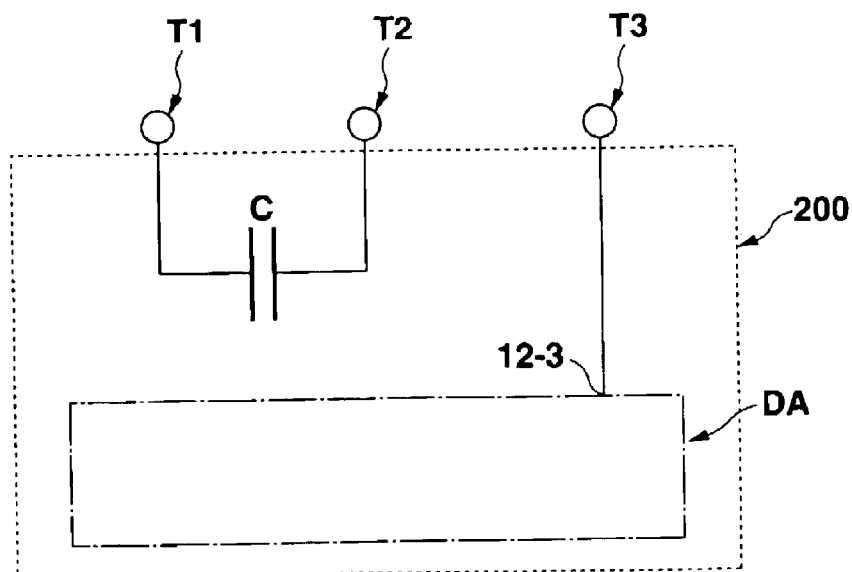
FIG. 20B is an equivalent circuit diagram corresponding to the connection mode of the capacitance element shown in FIG. 20A.

Concerning the equivalent circuit, the both ends of the capacitance element C are connected to only the external connection terminals T1 and T2, respectively, as shown in FIG. 20B.

Figure 21A:
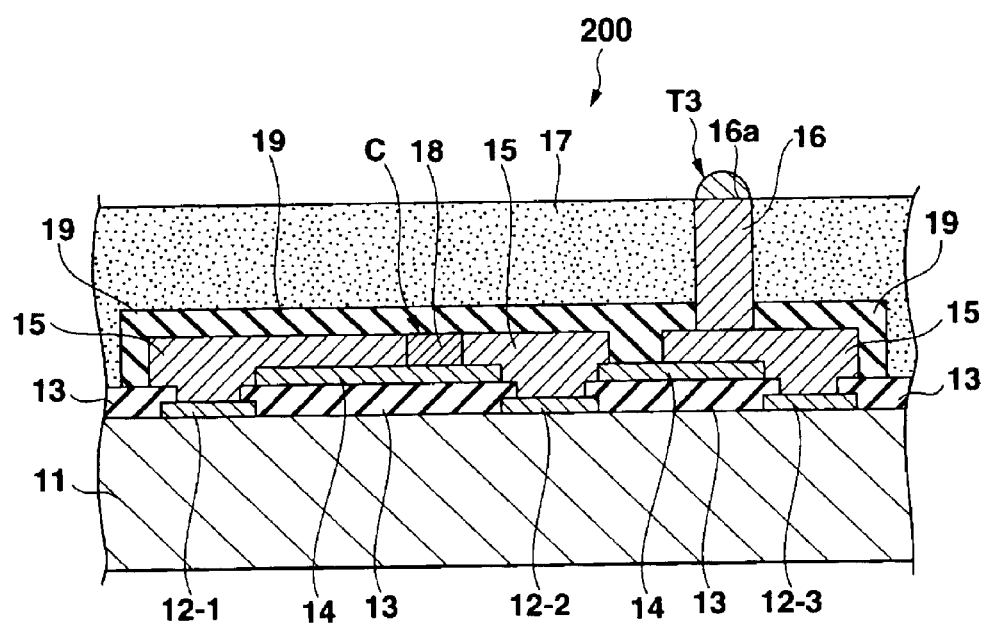
FIG. 21A is a cross sectional view showing a second connection mode of a capacitance element according to the second embodiment of the present invention.

FIG. 21A shows the second connection mode of the capacitance element in the second embodiment of the present invention, covering the case where the dielectric material layer 18 is formed in the clearance between the pieces of the conductive layer 15 which are connected to the connection pads 12-1 and 12-2, and the post 16 is not formed on the piece of the conductive layer 15 involved in the formation of the capacitance element C. Incidentally, the post 16 is formed on the piece of the conductive layer 15, which is not involved in the formation of the capacitance element, so as to be connected to the external connection terminal T3.

Figure 21B:
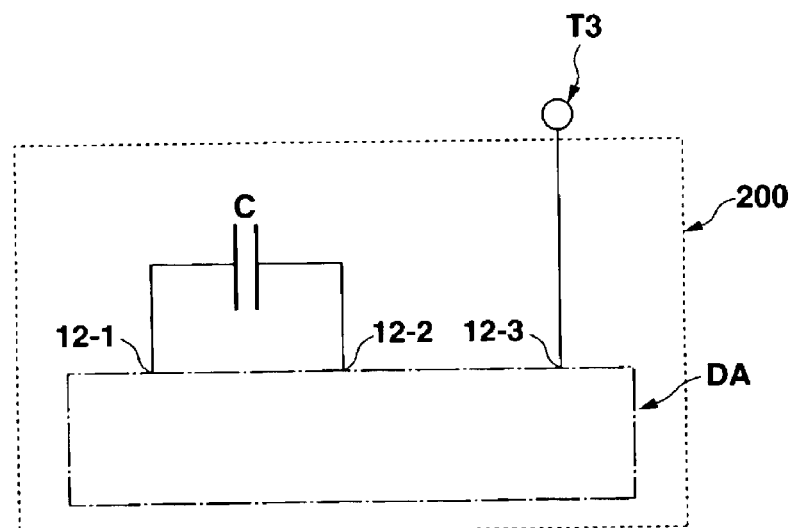
FIG. 21B is an equivalent circuit diagram corresponding to the connection mode of the capacitance element shown in FIG. 21A.

Concerning the equivalent circuit, both the ends of the capacitance element C are connected to only the circuit element of the circuit element-forming region DA, as shown in FIG. 21B.

Figure 22A:
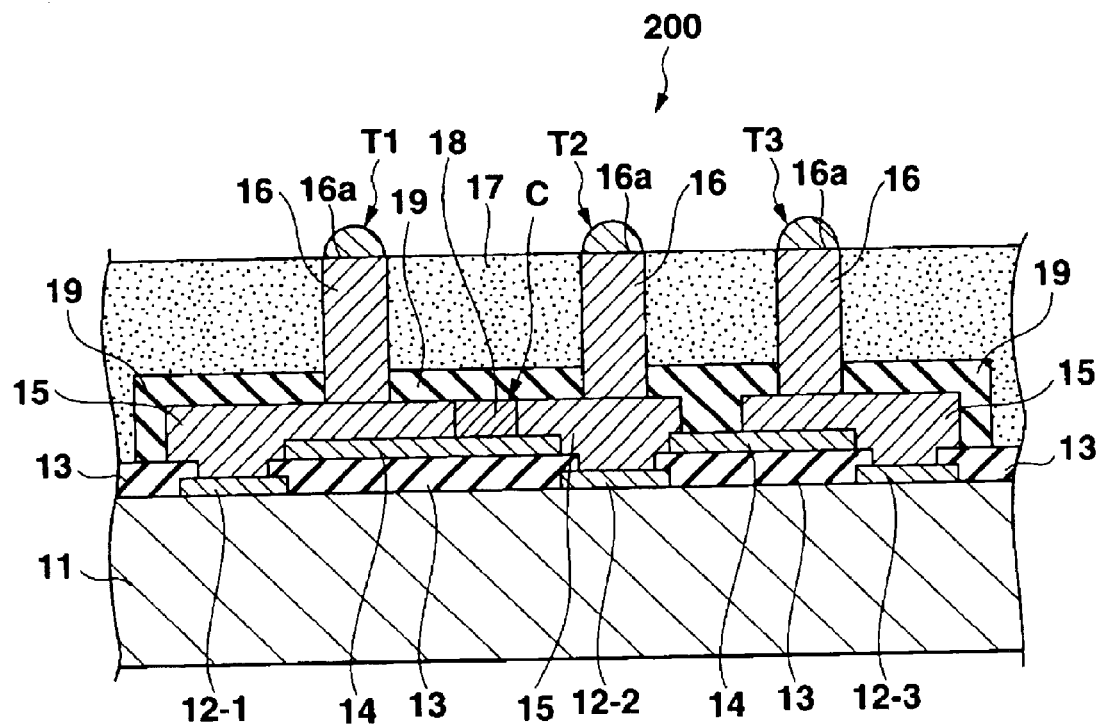
FIG. 22A is a cross sectional view showing a third connection mode of a capacitance element according to the second embodiment of the present invention.

FIG. 22A shows the third connection mode of the capacitance element in the second embodiment of the present invention, covering the case where the dielectric material layer 18 is arranged in the clearance between those pieces of the adjacent conductive layers 15 which are connected to the connection pads 12-1 and 12-2 so as to form the capacitance element C, and the posts 16 are formed on those pieces of the conductive layers 15 which are involved in the formation of the capacitance element C so as to be connected to the external connection terminals T1 and T2. Incidentally, the ports or post 16 is also formed on that the conductive layers or layer 15, which is not involved in the formation of the capacitance element, so as to be connected to the external connection terminal terminals or T3.

Figure 22B:
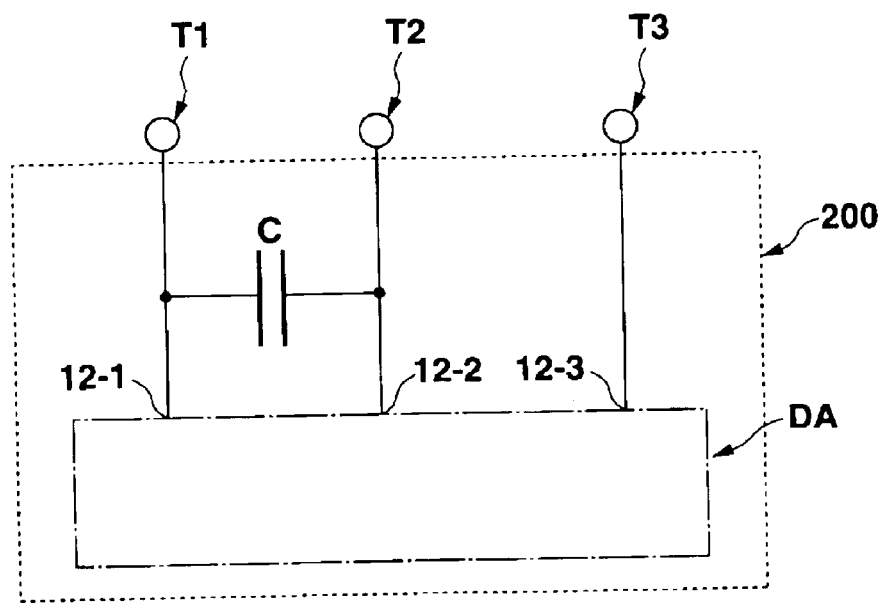
FIG. 22B is an equivalent circuit diagram corresponding to the connection mode of the capacitance element shown in FIG. 22A.

Concerning the equivalent circuit, the both ends of the capacitance element C are connected to the circuit element in the circuit element-forming region DA and to the external connection terminals T1 and T2, as shown in FIG. 22B.

Figure 23A:
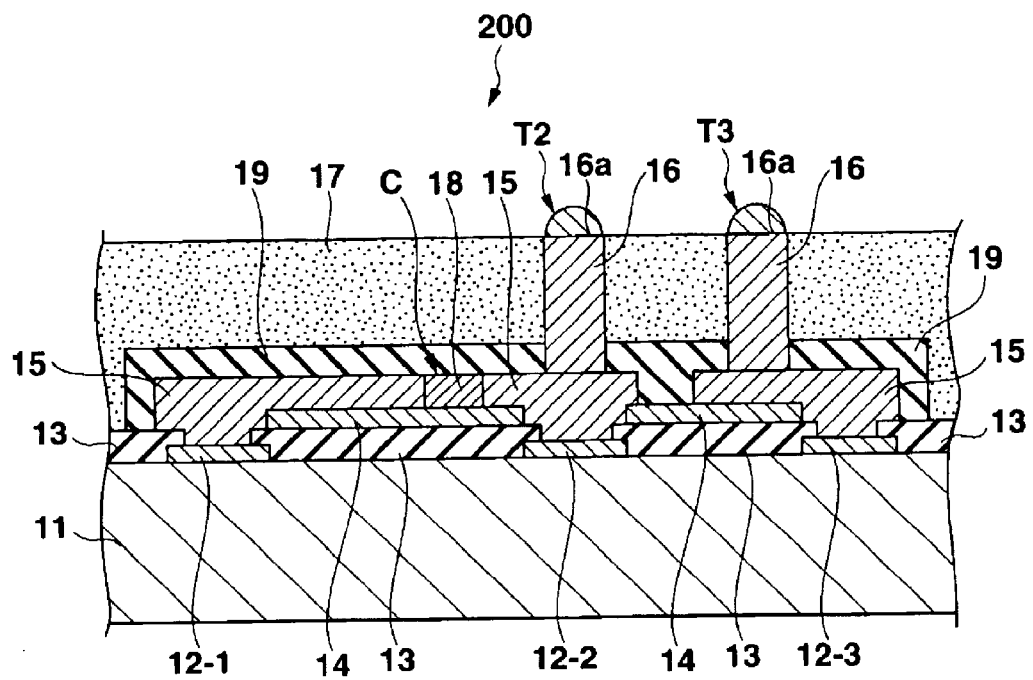
FIG. 23A is a cross sectional view showing a fourth connection mode of a capacitance element according to the second embodiment of the present invention.

FIG. 23A shows the fourth connection mode of the capacitance element in the second embodiment of the present invention, covering the case where the dielectric material layer 18 is formed in the clearance between those pieces of the conductive layers 15 which are connected to the connection pad 12-1 and the connection pad 12-2, respectively, so as to form the capacitance element C, and the post 16 is formed on one of these pieces of the conductive layers 15 which are connected to the connection pads 12-1 and 12-2 so as to be connected to the external connection terminal T2. Incidentally, the post 16 is also formed on that piece of the conductive layer 15 which is not involved in the formation of the capacitance element C so as to be connected to the external connection terminal T3.

Figure 23B:
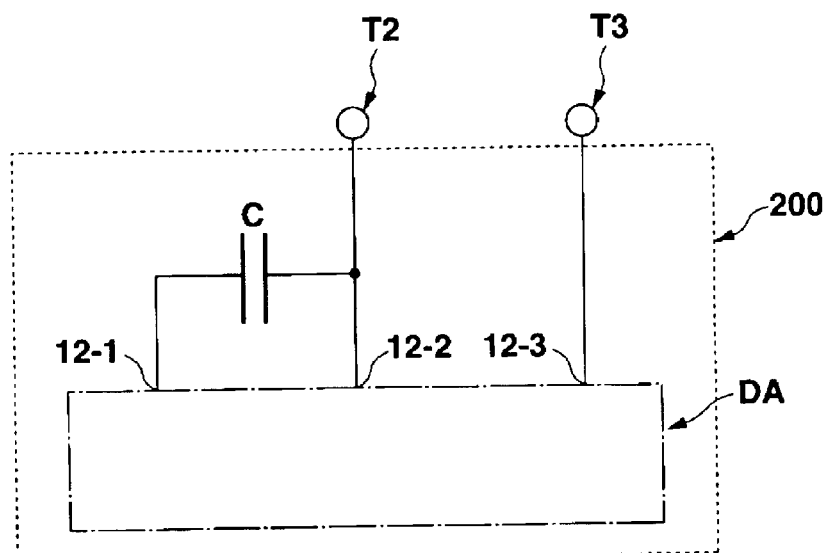
FIG. 23B is an equivalent circuit diagram corresponding to the connection mode of the capacitance element shown in FIG. 23A.

Concerning the equivalent circuit, one end of the capacitance element C is connected to the circuit element in the circuit element-forming region DA, with the other end being connected to both the circuit element in the circuit element-forming region DA and the external connection terminal T2, as shown in FIG. 23B.

Needless to say, it is possible for the various connection modes shown in FIGS. 20A to 23A to be present in a mixed fashion.

As described above, according to the second embodiment of the present invention, a planar capacitance element is formed in the circuit element-forming region DA in a three dimensional direction so as to be connected to the circuit element. The particular construction makes it possible to mount the capacitance element without increasing the chip area. As a result, it is possible to diminish the chip area. What should also be noted is that, since the capacitance element, which was required to be mounted outside the chip in the prior art, can be mounted within the chip in the case of constructing a module equipped with, for example, the wireless I/F function, the particular construction of the present invention contributes to the miniaturization of the module size.

Also, in order to suppress the influences given by the capacitance element to the other conductive layers, i.e., the influences such as the crosstalk caused by the stray capacitance and the parasitic capacitance, it is desirable to arrange a ground layer made of the material equal to that of the conductive layer 15 in a position in the vicinity of the plane flush with the conductive layer 15.

<Third Embodiment>

Figure 24:
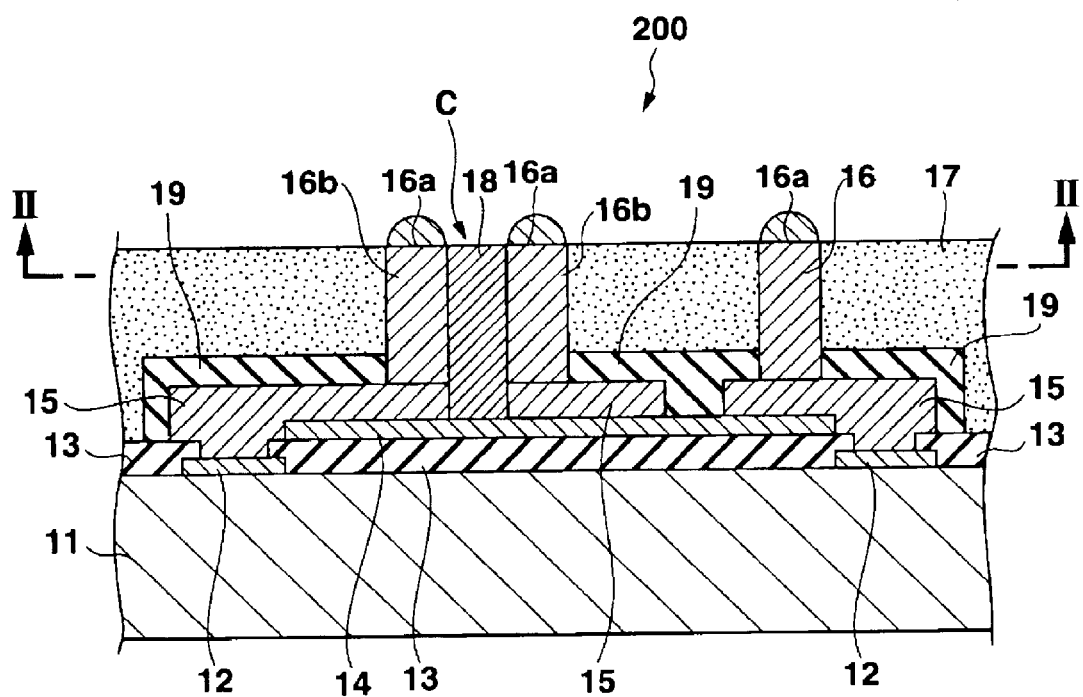
FIG. 24 is a cross sectional view showing the construction of a semiconductor device according to a third embodiment of the present invention.
Figure 25A:
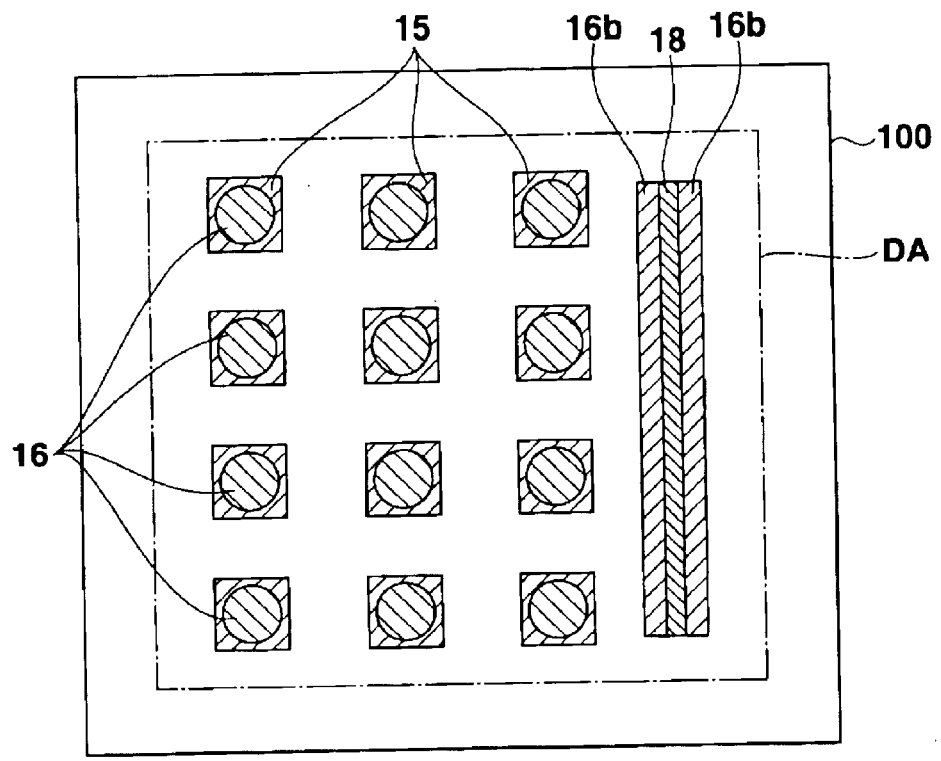
FIG. 25A is a cross sectional view along the line III—III shown in FIG. 24 showing a first example of the gist portion of the semiconductor device.
Figure 25B:
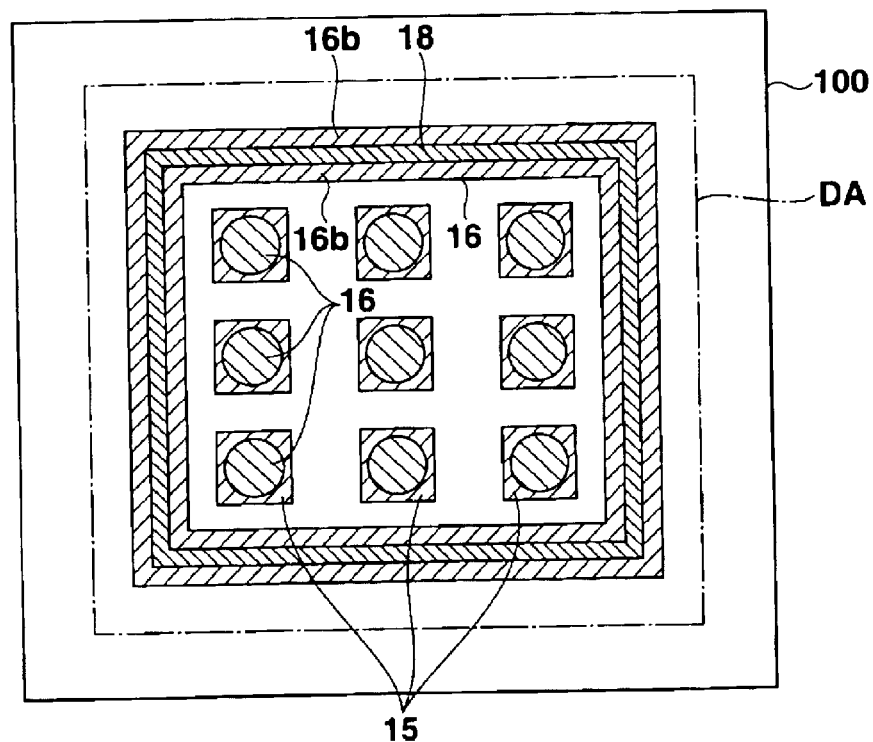
FIG. 25B is a cross sectional view along the line III—III shown in FIG. 24 showing a second example of the gist portion of the semiconductor device.

FIG. 24 is a cross sectional view showing the semiconductor device 200 according to a third embodiment of the present invention, with FIGS. 25A and 25B showing the gist portion of the semiconductor device 200 excluding the sealing layer 17 in the cross section along the line III—III shown in FIG. 24. In these drawings, the members of the semiconductor device common with those of the semiconductor device according to the first embodiment of the present invention are denoted by the same reference numerals so as to avoid an overlapping description.

The semiconductor device according to the third embodiment of the present invention comprises a plurality of the conductive layers 15 arranged adjacent to each other on the first protective layer 14 and posts 16b arranged adjacent to each other on the conductive layers 15. What should be noted is that the dielectric material layer 18 is formed in the clearances between the opposite sides of the adjacent conductive layers 15 and between the adjacent posts 16b. In other words, the dielectric material layer 18 forming the thin film passive element is sandwiched between the adjacent the conductive layers 15 and between the adjacent posts 16b so as to form a planar capacitance element C. In this case, each of the posts 16b having the dielectric material layer 18 sandwiched therebetween is preferably formed in the shape of a column having a rectangular cross section or in the shape of a plate. The particular construction makes it possible to increase the area of the dielectric material layer 18, compared with the second embodiment described previously, so as to increase the capacitance value of the capacitance element C. Incidentally, it is possible for the dielectric material layer 18 to be sandwiched between the plate-like posts 16b alone.

The planar capacitance element C thus formed can be arranged in various modes on the chip in accordance with the shapes of the conductive layer 15 and the posts 16b having the dielectric material layer 18 sandwiched therebetween. For example, it is possible to form the posts 16b in the shape of slender plates and to arrange the capacitance element C on the chip in the mode shown in FIG. 25A. It is also possible to arrange, for example, the plate-like posts 16b in a manner to surround the periphery of the chip and to arrange the capacitance element C to surround the periphery of the chip, as shown in FIG. 25B. Where the capacitance element C is arranged as shown in FIG. 25A or 25B, it is possible to further increase the area of the dielectric material layer 18 so as to make it possible to form the capacitance element C having a large capacitance.

In the semiconductor device 200 of the construction described above, it is possible to connect the capacitance element C to the circuit element of the circuit element-forming region DA in various modes, as in the second embodiment of the present invention described previously. Needless to say, it is possible to connect the capacitance element C in a mixed fashion of these various connecting modes.

As described above, according to the third embodiment of the present invention, the dielectric material layer 18 is sandwiched between the adjacent the conductive layers 15 and between the adjacent posts 16b so as to form a planar capacitance element. The particular construction makes it possible to mount a capacitance element larger than that in the second embodiment. It follows that it is possible to further miniaturize the chip area. It is also possible to further miniaturize the module size in the case of constructing a module equipped with, for example, the wireless I/F function.

<Fourth Embodiment>

Figure 26:
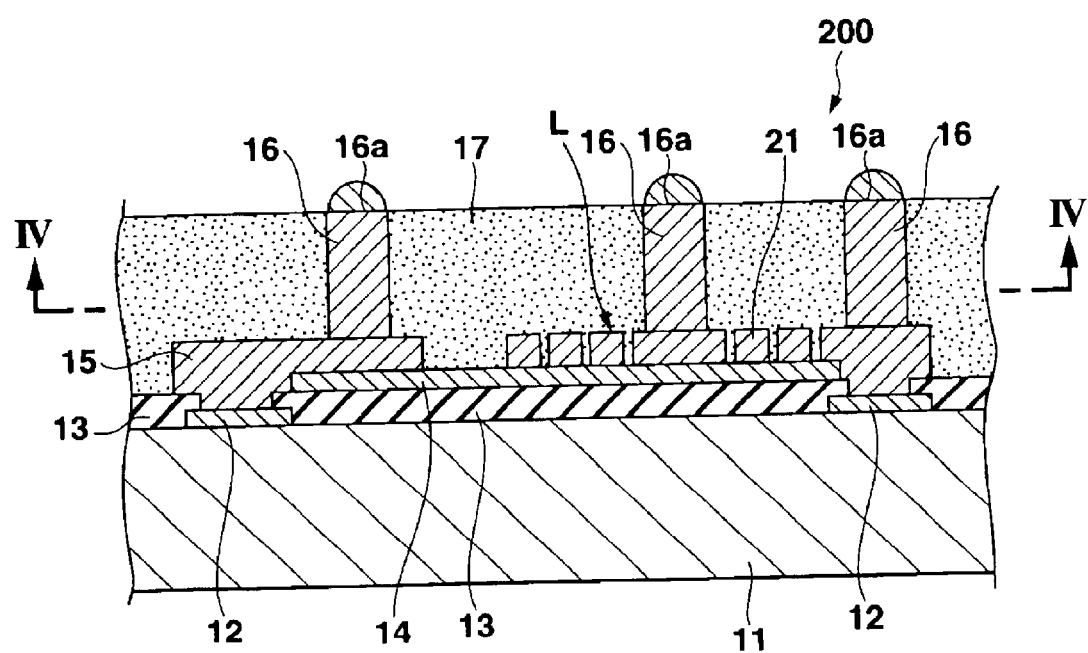
FIG. 26 is a cross sectional view showing the construction of a semiconductor device according to a fourth embodiment of the present invention.
Figure 27A:
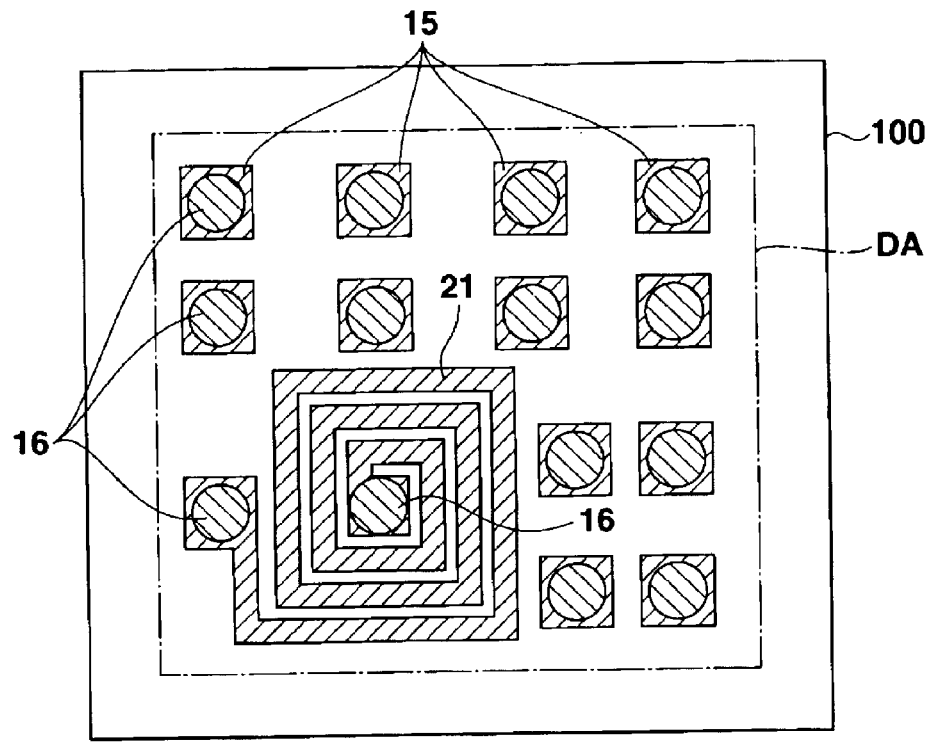
FIG. 27A is a cross sectional view along the line IV—IV shown in FIG. 26 showing a first example of the gist portion of the semiconductor device.
Figure 27B:
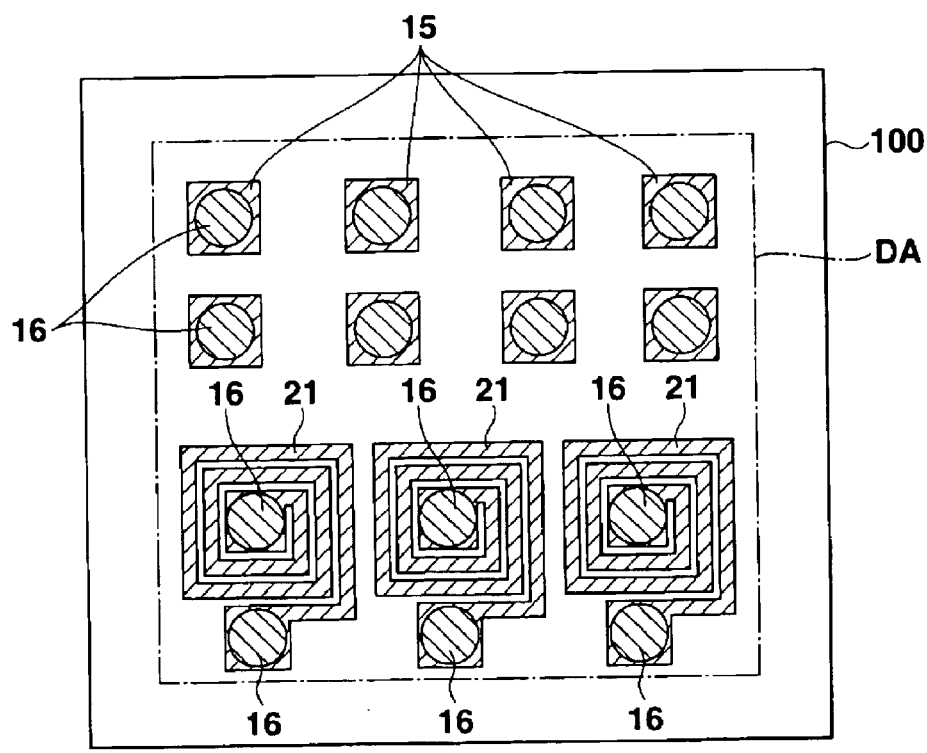
FIG. 27B is a cross sectional view along the line IV—IV shown in FIG. 26 showing a second example of the gist portion of the semiconductor device.

FIG. 26 is a cross sectional view showing the semiconductor device 200 according to a fourth embodiment of the present invention, with FIGS. 27A and 27B showing the gist portion of the semiconductor device 200 excluding the sealing layer 17 in the cross section along the line IV—IV shown in FIG. 26. In these drawings, the members of the semiconductor device common with those of the semiconductor device according to the first embodiment of the present invention are denoted by the same reference numerals so as to avoid an overlapping description.

The semiconductor device 200 according to the fourth embodiment of the present invention comprises the conductive layers 15 connected to the connection pads 12 and a conductive layer 21 patterned to generate an inductance component, each of these conductive layers 15 and 21 being formed on the first protective layer 14, as shown in FIG. 26. As a result, an inductance element L acting as a thin film passive element is formed in the semiconductor device 200.

In the case of the construction shown in FIG. 26, one end of the inductance element L is connected to the connection pad 12 via the conductive layer 21 so as to be connected to the circuit element in the circuit element-forming region DA, and the post 16 is formed in contact with the conductive layer 21. On the other hand, the post 16 is formed on the side of the other end of the inductance element L.

The conductive layer 21 forming the inductance element is shaped to generate the inductance component. For example, the conductive layer 21 is shaped like, for example, an angular eddy form, a rectangular wave form or a loop form.

The inductance element L of the particular construction, which is formed in the circuit element-forming region DA of the semiconductor substrate 11, can be arranged in various modes, as required. For example, it is possible to arrange the inductance element L, which is patterned in an angular eddy form and formed in a relatively large size in a manner to have a relatively large inductance component, as shown in FIG. 27A. It is also possible to arrange a plurality of inductance elements L side by side as shown in FIG. 27B.

FIGS. 28 to 32 are cross sectional views collectively showing the method of manufacturing the semiconductor device 200 according to the fourth embodiment of the present invention. The manufacturing method will now be described with reference to these drawings.

Figure 28:
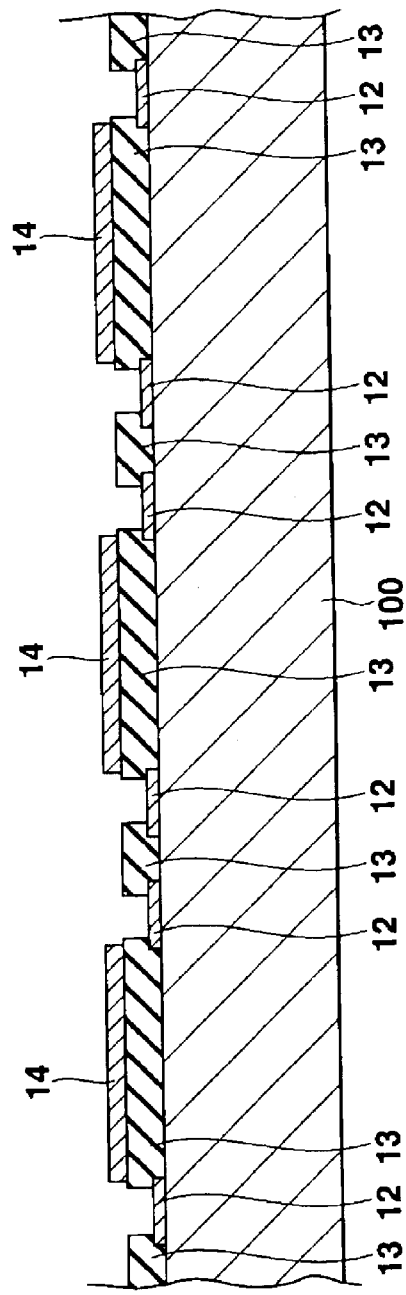
FIGS. 28 to 32 are cross sectional views collectively showing a method of manufacturing a semiconductor device according to the fourth embodiment of the present invention.

In the manufacturing method of the semiconductor device according to the fourth embodiment of the present invention, a passivation film 13 consisting of, for example, silicon oxide or silicon nitride is formed first on the upper surface of a plurality of connection pads 12 consisting of, for example, aluminum electrodes formed in each chip-forming region in a manner to expose the central portion of each of the connection pads 12, followed by forming the first protective layer 14 on the upper surface of the passivation film 13 in a manner to form an opening in the central portion of each connection pad 12, as shown in FIG. 28. The first protective film 14 is formed by coating the entire surface on the circuit side of the semiconductor wafer 100 with a polyimide series resin material and, then, curing the coated resin material, followed by peeling off the resist after a resist patterning and a protective film patterning are applied by using an etching solution. For forming the first protective layer 14, it is also possible to employ a printing method using a squeegee and a coating method utilizing an ink ejection from a nozzle. Also, the material of the protective film is not limited to the polyimide series resin material. Specifically, it is also possible to use an epoxy series resin material or PBO (benzaoxidole series) as a material of the protective film.

Figure 29:
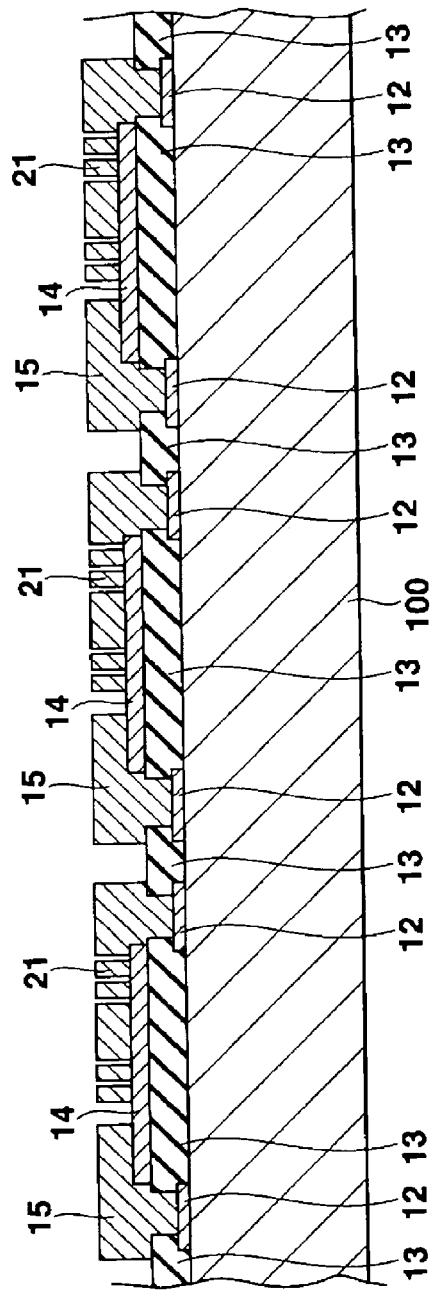

In the next step, the first conductive layers or layer 15 and the conductive layers or layer 21 forming at least one inductance element L are formed on the connection pads 12 exposed through the open portions formed in the first protective film 14, as shown in FIG. 29. For forming the conductive layer 15 and the conductive layer 21, a UBM layer (not shown) is deposited on the entire surface of the first protective film 14 by, for example, a UBM sputtering method, followed by coating and curing a photoresist for each of the conductive layer 15 and the conductive layer 21 for forming the inductance element. Then, a patterning of a predetermined shape is applied by the photolithography technology, followed by applying an electroplating to the portions opened by the resist. It is also possible to employ an electroless plating for forming the conductive layer 15 and the conductive layer 21 for forming the inductance element L. The wiring material used for forming the conductive layer includes, for example, copper, aluminum and gold each having good conductive properties.

Figure 30:
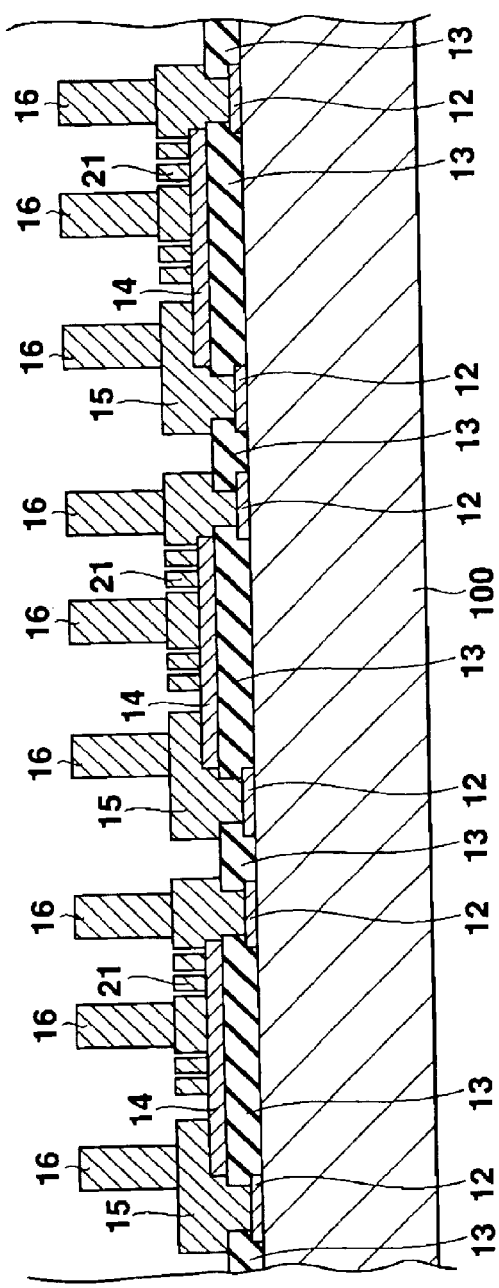

In the next step, the posts 16 are formed in predetermined positions on the conductive layer 15 and the conductive layer 21, as shown in FIG. 30. For forming the posts 16, a photoresist for the post formation is coated in a thickness of, for example, at least 50 µm and, typically 100 to 150 µm, followed by curing the coated photoresist. Then, open portions exposing predetermined positions of the conductive layer 15 and the inductance element L are formed in the cured photoresist, followed by applying an electroplating to the open portions noted above so as to form the posts 16. It is also possible to employ the electroless plating method and the stud bump method for forming the post 16. The material of the post 16 includes, for example, copper, a solder, gold and nickel each having good conductive characteristics. Where a solder is used as a material for forming the post 16, it is possible to form a spherical electrode by applying a reflow treatment to the solder. Also, in the case of forming the post 16 by using a solder, it is also possible to employ a printing method in addition to the method described above.

Figure 31:
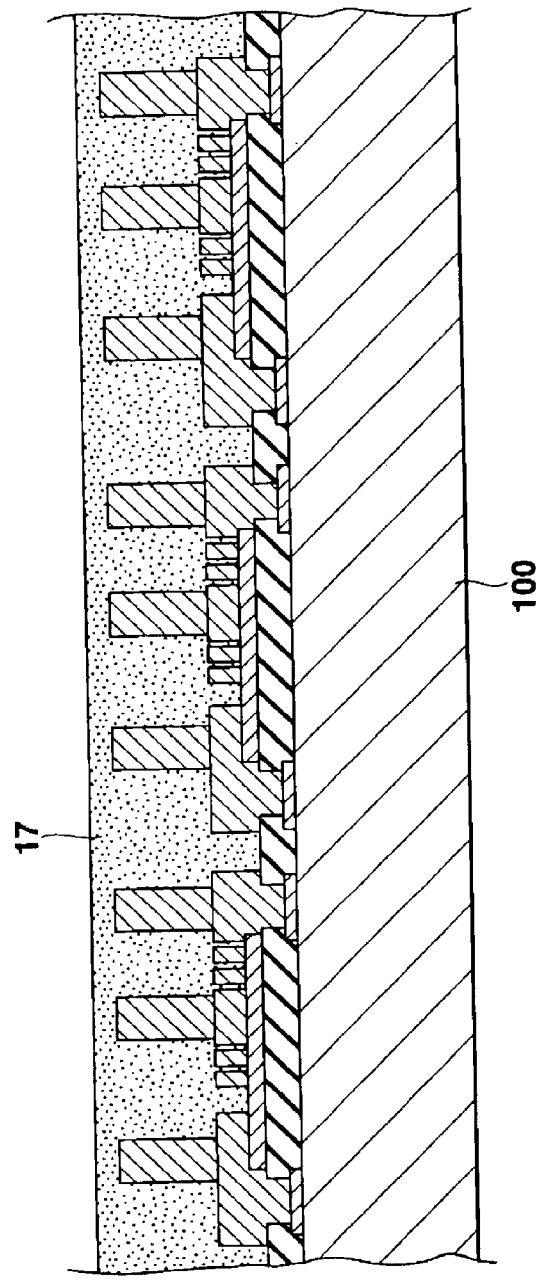

In the next step, the sealing film 17 is formed by, for example, molding the entire circuit surface of the semiconductor wafer 100 with a resin material such as an epoxy resin in a manner to cover the posts 16, as shown in FIG. 31. In order to ensure the reliability conforming with the change in the environment, it is desirable for the sealing film 17 to be formed of a resin material having a main component substantially equal to that of the first protective film 14 described above. For forming the sealing film 17, it is possible to employ, for example, a printing method, a dipping method, a spin coating method or a die coating method.

Figure 32:
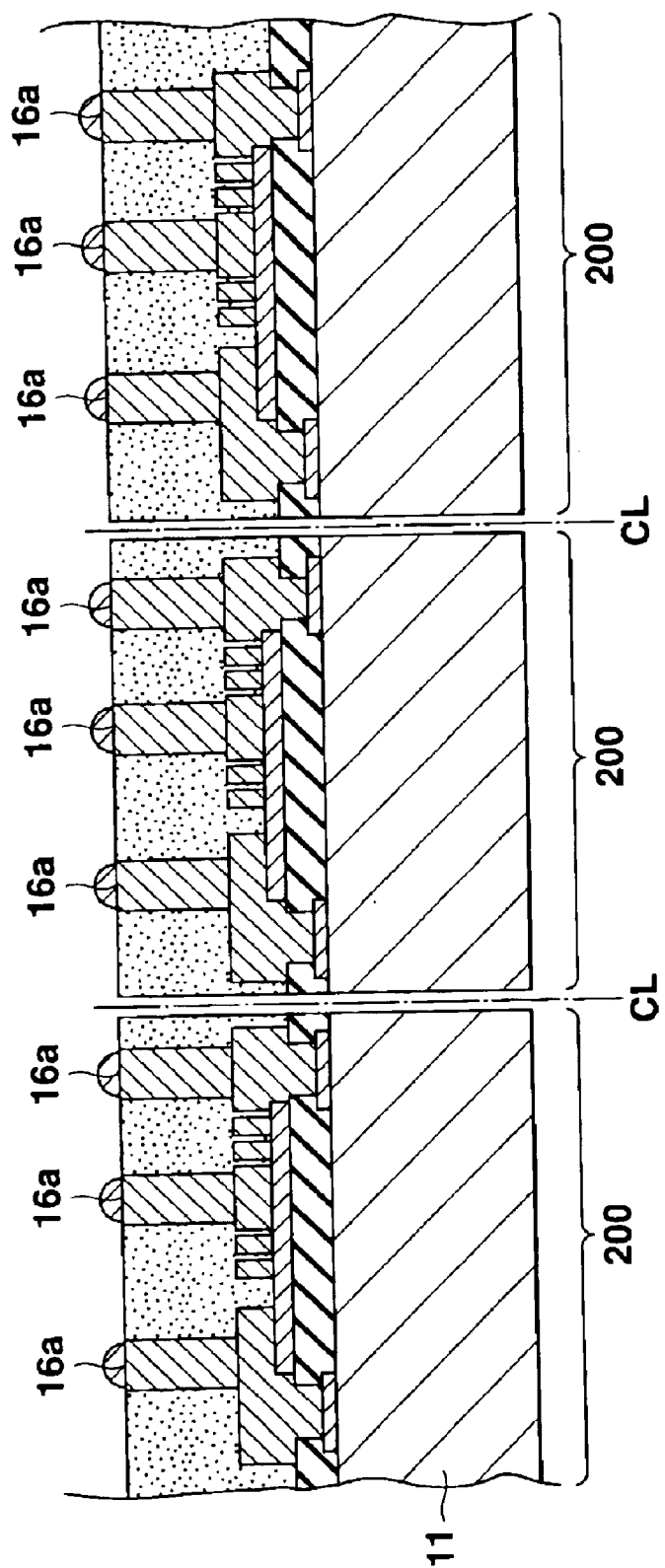

In the next step, the upper surface of the sealing film 17 is cut and polished so as to expose the edge surface 16a of the post 16, followed by removing the oxide film from the surface and, then, applying a metallizing treatment such as a solder plating to the edge surface 16a, as shown in FIG. 32. Further, dicing is applied along the cut lines CL conforming with the chip forming regions so as to divide the semiconductor wafer 100 into the individual chip forming regions, thereby forming the individual semiconductor substrates 11. In this fashion, the semiconductor device 200 of the construction as shown in FIG. 26 is obtained.

In the semiconductor device 200 of the construction described above, the inductance element L is formed in the circuit element-forming region DA and, thus, the inductance element L can be arranged on the circuit element-forming region DA in various modes in accordance with the modes of arrangement of the conductive layer 21 and the posts 16. FIGS. 33A to 36A are cross sectional views showing the connection modes of the inductance element L in accordance with the modes of arrangement of the conductive layer 21 and the posts 16 in the semiconductor device 200. On the other hand, FIGS. 33B to 36B show the corresponding equivalent circuit diagrams.

Figure 33A:
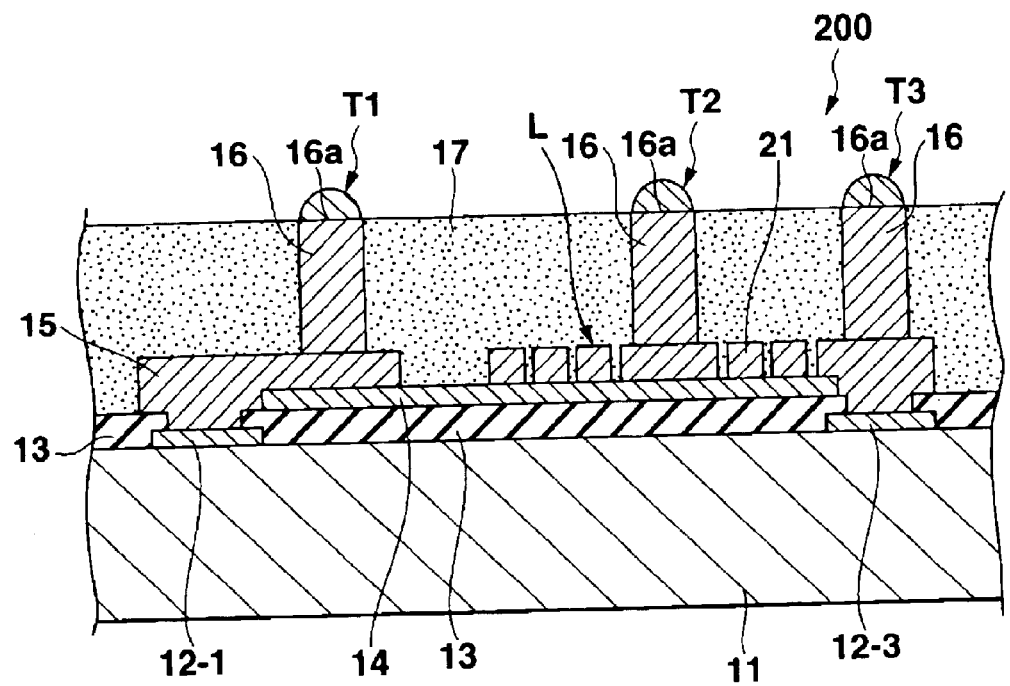
FIG. 33A is a cross sectional view showing a first connection mode of an inductance element according to the fourth embodiment of the present invention.
Figure 33B:
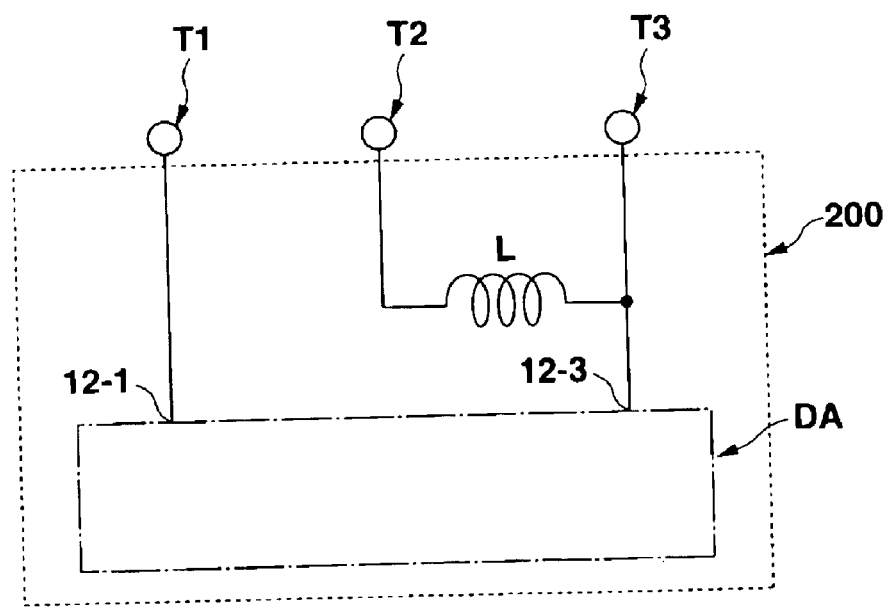
FIG. 33B is an equivalent circuit diagram corresponding to the connection mode of the inductance element shown in FIG. 33A.

FIG. 33A shows the first connection mode of the inductance element in the fourth embodiment of the present invention, covering the case where the inductance element L is formed on the conductive layer 21 connected to the connection pad 12-2, and the posts 16 are formed on both edges of the conductor 21 so as to be connected to the external connection terminals T2 and T3. The post 16 is also formed on the conductor 15, which is not involved in the formation of the inductance element, so as to be connected to the external connection terminal T1.

Concerning the equivalent circuit, one end of the inductance element L is connected to the circuit element in the circuit element-forming region DA and to the external connection terminal T3. The other end of the inductance element L is also connected to the external connection terminal T2.

Figure 34A:
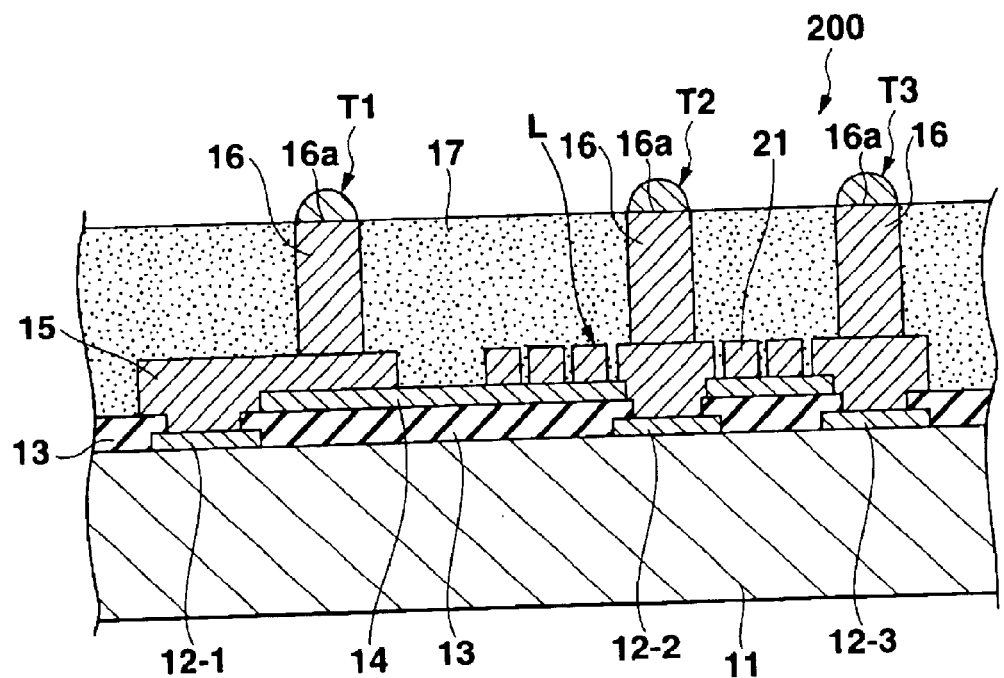
FIG. 34A is a cross sectional view showing a second connection mode of an inductance element according to the fourth embodiment of the present invention.

FIG. 34A shows the second connection mode of the inductance element according to the fourth embodiment of the present invention, covering the case where the both ends of the conductive layer 21 forming the inductance element L are connected to the connection pad 12-2 and to the connection pad 12-3, respectively, and the posts 16 are mounted to the both edges of the inductance element L formed by the conductive layer 21 so as to be connected to the external connection terminals T2, T3. Incidentally, the post 16 is also mounted to the conductive layer 15, which is not involved in the formation of the inductance element L, so as to be connected to the external connection terminal T1.

Figure 34B:
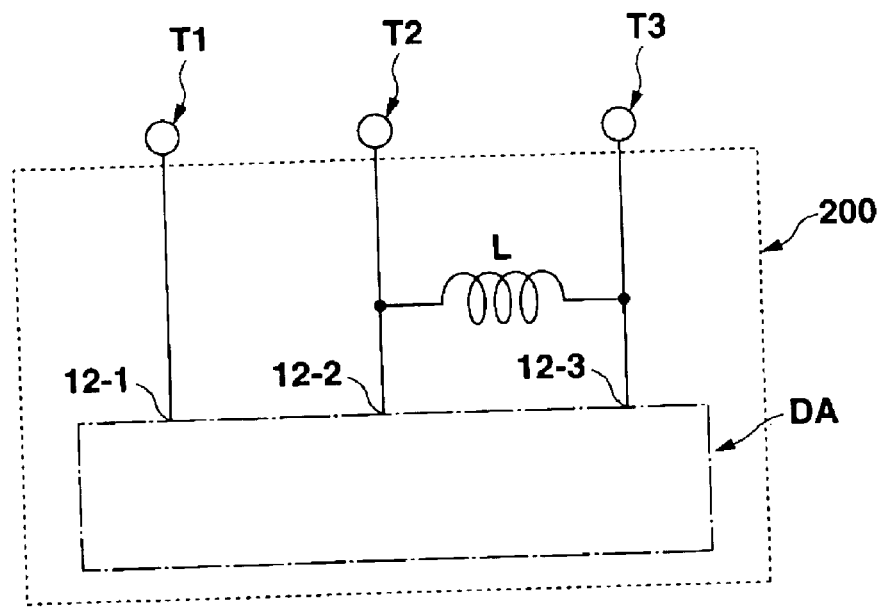
FIG. 34B is an equivalent circuit diagram corresponding to the connection mode of the inductance element shown in FIG. 34A.

Concerning the equivalent circuit, both ends of the inductance element L are connected to the circuit element in the circuit element-forming region DA and also connected to the external connection terminals T2 and T3, as shown in FIG. 34B.

Figure 35A:
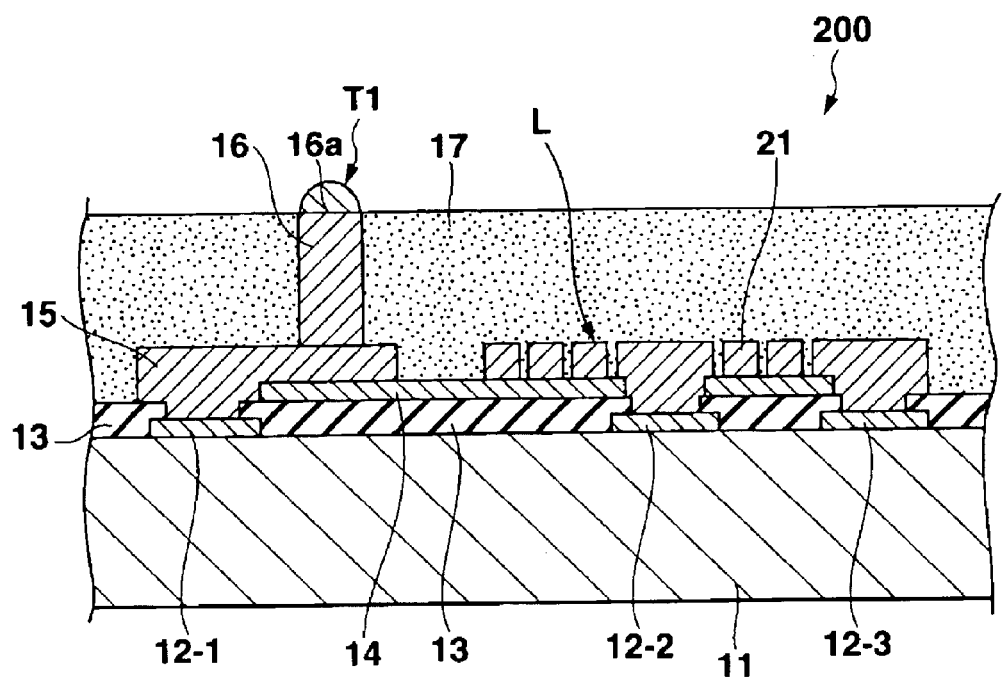
FIG. 35A is a cross sectional view showing a third connection mode of an inductance element according to the fourth embodiment of the present invention.
Figure 35B:
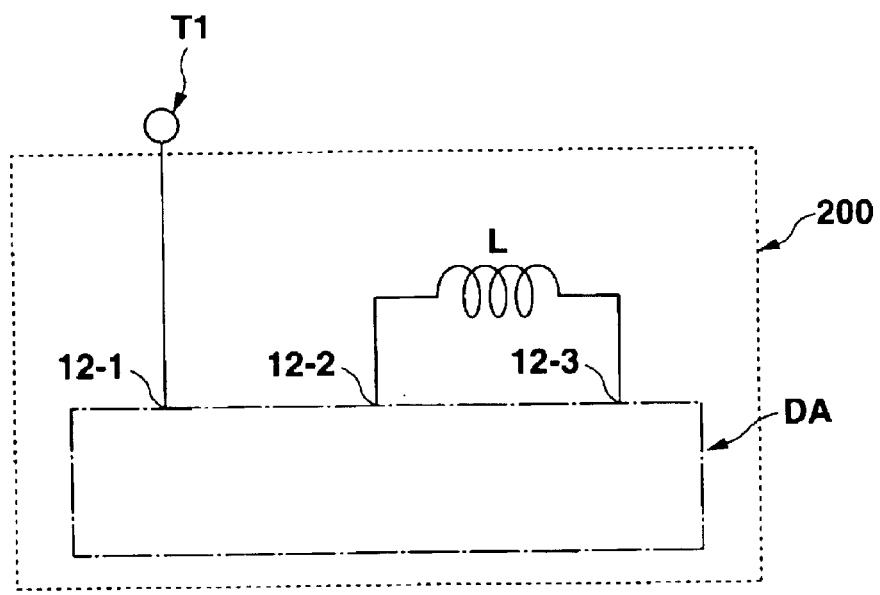
FIG. 35B is an equivalent circuit diagram corresponding to the connection mode of the inductance element shown in FIG. 35A.

FIG. 35A shows the third connection mode of the inductance element according to the fourth embodiment of the present invention, covering the case where the both ends of the conductive layer 21 forming the inductance element L are connected to the connection pad 12-2 and the connection pad 12-3, and the post 16 is mounted to the conductive layer 15, which is not involved in the formation of the inductance element, so as to be connected to the external connection terminal T1.

Concerning the equivalent circuit, both ends of the inductance element L are connected to only the circuit element in the circuit element-forming region DA.

Figure 36A:
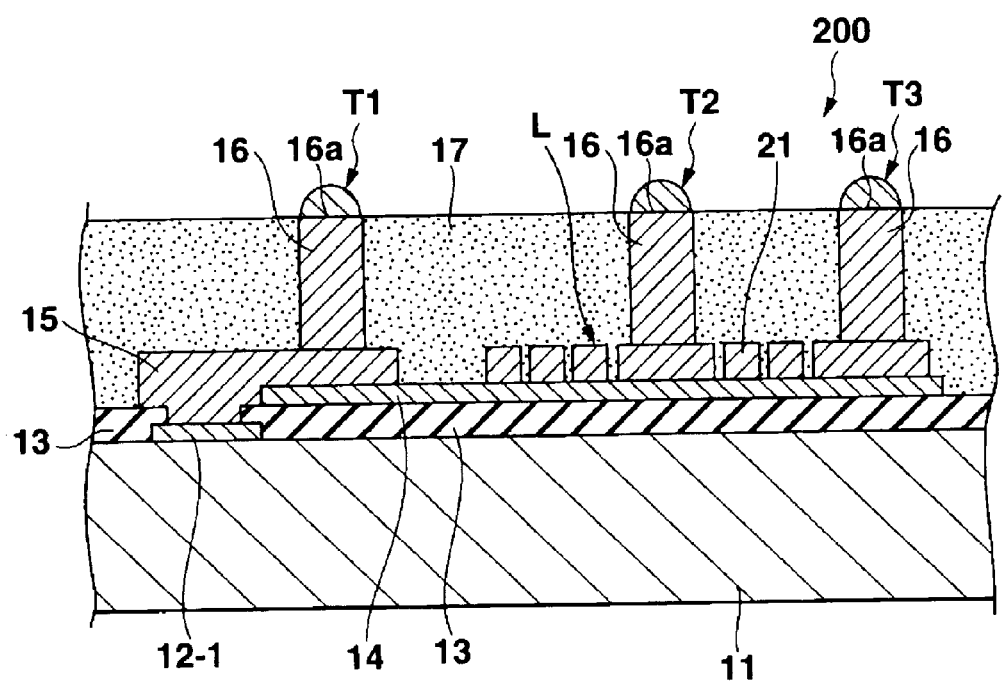
FIG. 36A is a cross sectional view showing a fourth connection mode of an inductance element according to the fourth embodiment of the present invention.

FIG. 36A shows the fourth connection mode of the inductance element according to the fourth embodiment of the present invention, covering the case where the posts 16 are mounted to both ends of the conductive layer 21 forming the inductance element L so as to be connected to the external connection terminals T2, T3, and the conductive layer 21 is not connected to the connection pad. Incidentally, the post 16 is mounted to the conductive layer 15, which is not involved in the formation of the inductance element, so as to be connected to the external connection terminal T1.

Figure 36B:
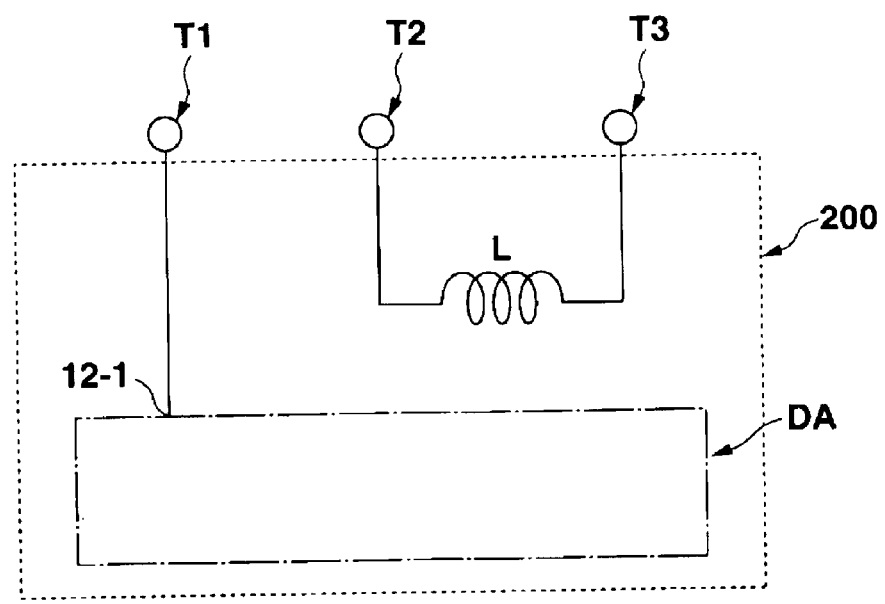
FIG. 36B is an equivalent circuit diagram corresponding to the connection mode of the inductance element shown in FIG. 36A.

Concerning the equivalent circuit, one end and the other end of the inductance element L are connected to only the external connection terminals T2 and T3, as shown in FIG. 36B.

Needless to say, it is possible for the various connection modes shown in FIGS. 33A to 36A to be employed in combination.

As described above, according to the fourth embodiment of the present invention, the inductance element is stacked on the circuit element-forming region DA so as to be connected to the circuit element, making it possible to mount the inductance element without inviting an increase in the chip area. As a result, it is possible to diminish the chip area. In addition, the inductance element, which was required to be mounted outside the chip in the prior art, can be mounted within the chip so as to contribute to the miniaturization of the module size in the case of constructing a module equipped with, for example, a wireless I/F function.

In the fourth embodiment described above, the inductance element L is formed of the single conductive layer 21. However, it is also possible to form a plurality of inductance elements by forming a stacked structure, which is prepared by alternately stacking an insulating film and the conductive layer 21.

Also, in order to suppress the influences given by the inductance element to the other conductive layers, i.e., the influences such as the crosstalk caused by the electromagnetic induction, it is desirable to arrange a ground layer made of the material equal to that of the conductive layer 21 in a position in the vicinity of the plane flush with the conductive layer 21.

<Fifth Embodiment>

Figure 37:
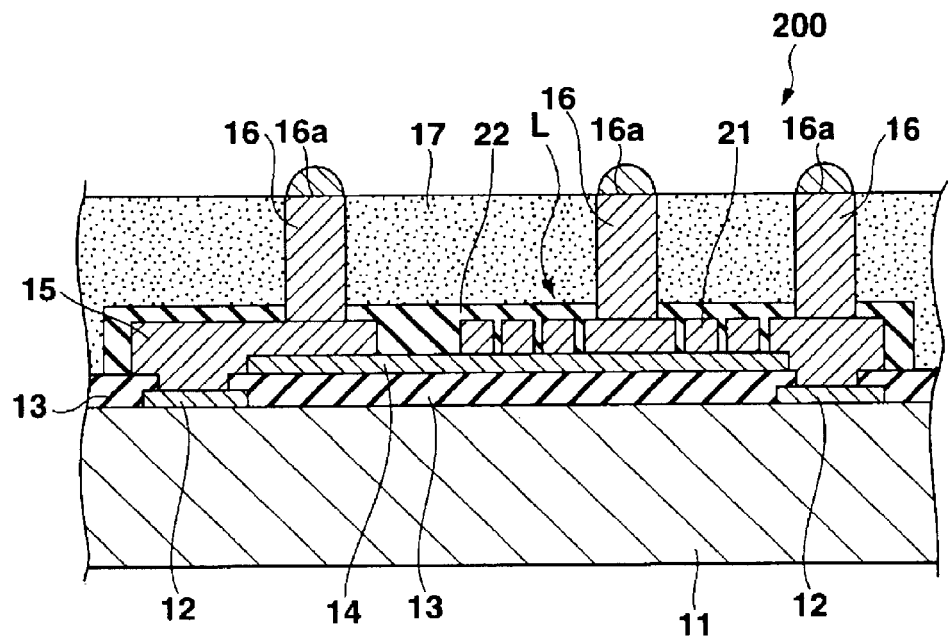
FIG. 37 is a cross sectional view showing the construction of a semiconductor device according to a fifth embodiment of the present invention.

FIG. 37 is a cross sectional view showing the semiconductor device 200 according to a fifth embodiment of the present invention. In FIG. 37, the members of the semiconductor device common with those of the semiconductor device according to the fourth embodiment of the present invention are denoted by the same reference numerals so as to avoid an overlapping description.

In the fifth embodiment, a third protective film 22 is formed on the conductive layer 21 forming the inductance element L as a thin film passive element and on the conductive layer 15, as shown in FIG. 37.

According to the particular construction shown in FIG. 37, the inductance element L is sandwiched between the first protective film 14 and the third protective film 22 so as to make it possible to obtain stable inductance characteristics.

For forming the third protective film 22, the conductive layer 15 and the conductive layer 21 forming the inductance element L are formed first. Then, the entire surface on the circuit side of the semiconductor wafer is coated with a polyimide series resin material, followed by curing the coated resin material like the first protective film 14 described previously. Further, a resist patterning and a protective film patterning are applied by using an etching solution, followed by peeling off the resist, thereby forming the third protective film 22.

<Sixth Embodiment>

Figure 38:
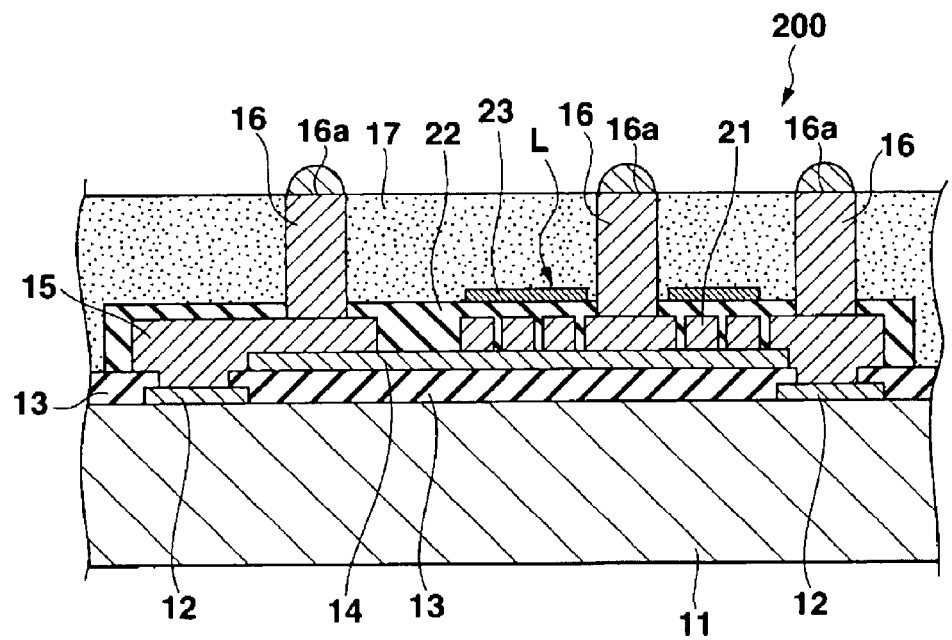
FIG. 38 is a cross sectional view showing the construction of a semiconductor device according to a sixth embodiment of the present invention.

FIG. 38 is a cross sectional view showing the semiconductor device 200 according to a sixth embodiment of the present invention. In FIG. 38, the members of the semiconductor device common with those of the semiconductor device according to the fourth embodiment of the present invention are denoted by the same reference numerals so as to avoid an overlapping description.

In the sixth embodiment, a magnetic film 23 is formed on the inductance element L forming a thin film passive element with the third protective film 22 interposed therebetween, in addition to the construction of the semiconductor device according to the fifth embodiment of the present invention. The magnetic film 23 can be formed of a ferromagnetic material. Alternatively, the magnetic film 23 can be formed by mixing a ferromagnetic material or a soft magnetic material in, for example, a resin.

By forming the magnetic film 23 on the inductance element L with the third protective film 22 interposed therebetween, it is possible to markedly increase the inductance value of the inductance element L so as to improve the characteristics as the inductance element. As a result, it is possible to diminish the size of the conductive layer 21 required for obtaining the same inductance value. It is also possible to improve the inductance characteristics.

Figure 39:
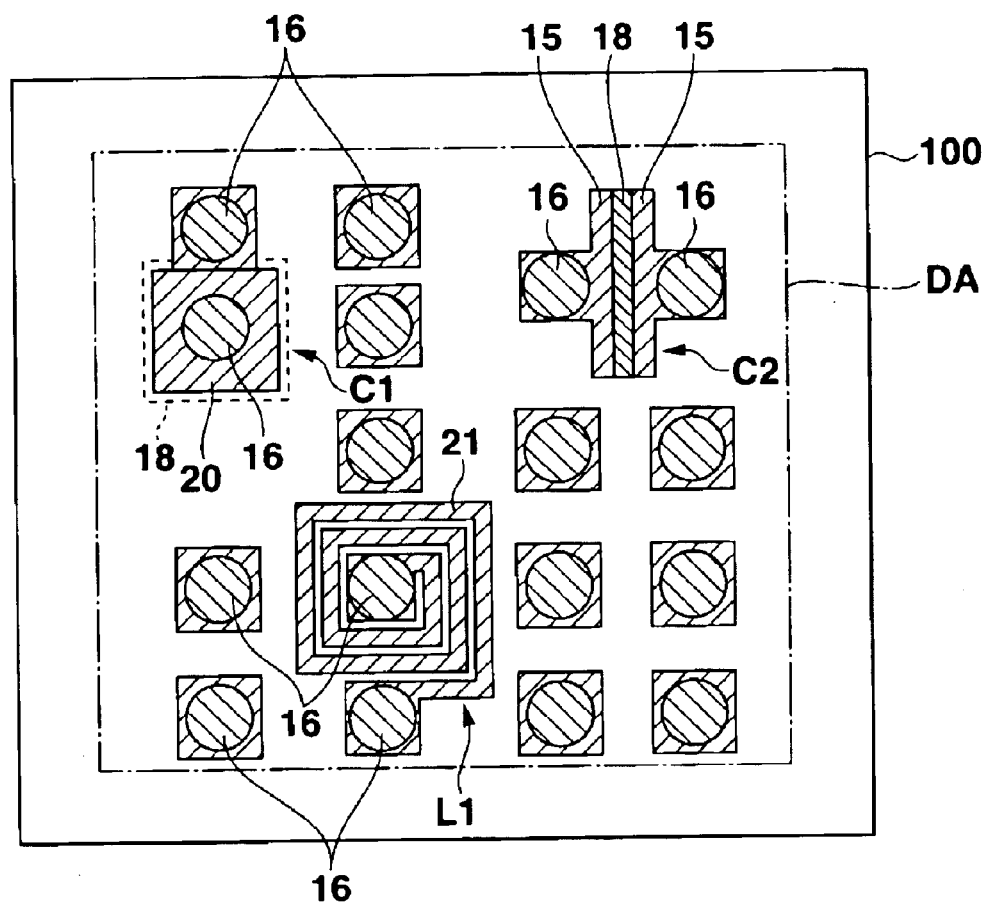
FIG. 39 is a cross sectional view showing the construction of a semiconductor device having the passive elements of the various embodiments of the present invention arranged therein.

As described above, according to each embodiment of the present invention, it is possible to integrally stack the capacitance element or the inductance element forming a passive element on the circuit element-forming region DA of the semiconductor device 200. Needless to say, it is possible for the capacitance element and the inductance element according to each embodiment of the present invention to be present in a mixed fashion on the circuit element-forming region DA. For example, as shown in FIG. 39, it is possible to form the capacitance element C1 according to the first embodiment of the present invention, the capacitance element C2 according to the second embodiment of the present invention and the inductance element L1 according to the fourth embodiment of the present invention, in the circuit element-forming region DA in the semiconductor device 200 in which a plurality of posts 16 are formed on the circuit element-forming region DA as shown in FIG. 39. In this case, it is possible to stack the capacitance elements and the inductance element without inviting an increase of the chip area. It follows that it is possible to further decrease the chip area and to mount the capacitance element and the inductance element required for the wireless I/F function within the chip in the case of constructing a module equipped with, for example, the wireless I/F function so as to further diminish the module size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate including a circuit element-forming region in which an integrated circuit is formed, and a plurality of connection pads;

an organic insulating film formed on said circuit element-forming region;

a plurality of columnar electrodes which each have an upper edge surface outwardly exposed for connection to an external device, including at least one columnar electrode formed over the circuit element-forming region;

a plurality of conductive layers formed on the organic insulating film and electrically connecting at least the connection pads and the at least one columnar electrode arranged over the circuit element-forming region;

at least one thin film passive element including a conductive layer formed on said insulating film, wherein the conductive layer of the thin film passive element and the plurality of conductive layers are laterally arranged and formed by a same layer of the semiconductor device; and a sealing film which is provided between the columnar electrodes, and which covers the thin film passive element and the semiconductor substrate except for the upper edge surface of each of the columnar electrodes.

2. The semiconductor device according to claim 1, wherein said thin film passive element comprises at least one capacitance element.

3. The semiconductor device according to claim 2, wherein:

said capacitance element includes two conductive layers and a dielectric material layer, said two conductive layers are stacked one upon the other on said insulating film, and said dielectric material layer is interposed between the conductive layers.

4. The semiconductor device according to claim 2, wherein:

said at least one conductive layer of said capacitance element includes at least two portions having opposing end surfaces and formed in one layer on said insulating film, and a dielectric material layer is formed in a clearance between the opposing end surfaces of the at least two portions.

5. The semiconductor device according to claim 2, wherein:

said at least one conductive layer of said capacitance element includes at least two portions having opposing end surfaces and formed in one layer on said insulating film, said columnar electrodes are formed as plate-like electrodes respectively positioned on the at least two portions, and a dielectric material layer is formed at least in a clearance between the opposing end surfaces of the plate-like electrodes.

6. The semiconductor device according to claim 1, wherein said thin film passive element comprises at least one inductance element.

7. The semiconductor device according to claim 6, wherein:

said inductance element includes one conductive layer having one of an angular eddy shape, a rectangular wave shape, and a loop shape, said connection pads include at least one first connection pad that is not electrically connected to any of said columnar electrodes, and at least one second connection pad electrically connected to at least one of said columnar electrodes, and said inductance element includes at least two terminals, at least one of which is connected to at least one of said first connection pad and said second connection pad.

8. The semiconductor device according to claim 7, wherein said inductance element further comprises a magnetic film formed on said one conductive layer.

9. The semiconductor device according to claim 1, wherein said thin film passive element includes at least two terminals, at least one of which is electrically connected to one of said columnar electrodes.

10. The semiconductor device according to claim 1, wherein said thin film passive element includes at least two terminals, at least one of which is electrically connected to one of said connection pads.

11. The semiconductor device according to claim 1, wherein said thin film passive element includes at least two terminals, each of which is electrically connected to at least one of said connection pads and said columnar electrodes.

12. The semiconductor device according to claim 1, wherein said at least one thin film passive element comprises a plurality of thin film passive elements.

13. A method of manufacturing a semiconductor device comprising:

preparing a semiconductor wafer substrate including a plurality of chip forming regions each having a circuit element-forming region in which an integrated circuit is formed, and a plurality of connection pads;

forming an organic insulating film on the circuit element-forming region of each of said chip forming regions;

forming a plurality of conductive layers connected to the connection cads;

forming a plurality of columnar electrodes which are provided for connection to an external device, and which are each electrically connected to at least one of said plurality of connection pads through said plurality of conductive layers. wherein at least one of said plurality of columnar electrodes is formed on said circuit element-forming region;

forming a plurality of thin film passive elements each including a conductive layer on said organic insulating film, wherein the conductive layer of the thin film passive element and the plurality of conductive layers are laterally arranged and formed by a same layer of the semiconductor device;

forming a sealing film on an exposed entire upper surface of the semiconductor wafer substrate between the columnar electrodes and covering the thin film passive elements and the columnar electrodes;

exposing only an upper edge surface of each of the columnar electrodes from the sealing film; and dividing said semiconductor wafer substrate into individual chip forming regions so as to form a plurality of semiconductor devices each having at least one of said thin film passive elements.

14. The method of manufacturing a semiconductor device according to claim 13, wherein said forming of said thin film passive elements comprises forming at least one capacitance element.

15. The method of manufacturing a semiconductor device according to claim 14, wherein said forming of each said capacitance element comprises:

forming a first conductive layer on the circuit element-forming region of said semiconductor substrate;

forming a dielectric material layer on said first conductive layer; and forming a second conductive layer on said dielectric material layer.

16. The method of manufacturing a semiconductor device according to claim 14, wherein said forming of each said capacitance element comprises:

forming on said insulating film one conductive layer having at least two portions having opposing end surfaces; and forming a dielectric material layer in a clearance between the opposing end surfaces of the at least two portions.

17. The method of manufacturing a semiconductor device according to claim 14, wherein said forming of each said capacitance element comprises:

forming on said insulating film one conductive layer having at least two portions having opposing end surfaces;

forming said columnar electrodes as plate-like electrodes which are opposed to each other respectively on the at least two portions; and forming a dielectric material layer in a clearance between said opposed plate-like electrodes.

18. The method of manufacturing a semiconductor device according to claim 13, wherein said forming of said thin film passive elements comprises forming at least one inductance element.

19. The method of manufacturing a semiconductor device according to claim 18, wherein said forming of each said inductance element comprises:

patterning one conductive layer in any one of an angular eddy shape, a rectangular wave shape and a loop shape;

forming said connection pads to include at least one first connection pad that is not electrically connected to any of said columnar electrodes, and at least one second connection pad electrically connected to at least one of said columnar electrodes, and forming at least two terminals, at least one of which is connected to at least one of said first connection pad and said second connection pad.

20. The method of manufacturing a semiconductor device according to claim 19, wherein said forming of the inductance element further comprises forming a magnetic film on said one conductive layer.

21. The method of manufacturing a semiconductor device according to claim 13, wherein said forming of said thin film passive elements comprises forming at least two terminals, at least one of which is electrically connected to one of said columnar electrodes.

22. The method of manufacturing a semiconductor device according to claim 13, wherein said forming of said thin film passive elements comprises forming at least two terminals, at least one of which is electrically connected to one of said connection pads.

23. The method of manufacturing a semiconductor device according to claim 13, wherein said forming of said thin film passive elements comprises forming at least two terminals, each of which is electrically connected to at least one of said connection pads and said columnar electrodes.

* * * * *